(12) United States Patent
Hamaguchi et al.

(10) Patent No.: US 9,746,775 B2
(45) Date of Patent: Aug. 29, 2017

(54) METHOD FOR MANUFACTURING SUBSTRATE HAVING CONCAVE PATTERN, COMPOSITION, METHOD FOR FORMING CONDUCTIVE FILM, ELECTRONIC CIRCUIT AND ELECTRONIC DEVICE

(71) Applicant: JSR CORPORATION, Minato-ku (JP)

(72) Inventors: Hitoshi Hamaguchi, Tokyo (JP); Kenrou Tanaka, Tokyo (JP); Kenzou Ookita, Tokyo (JP); Keisuke Kuriyama, Tokyo (JP)

(73) Assignee: JSR CORPORATION, Minato-ku (JP)

( * ) Notice: Subject to any disclaimer, the term of this patent is extended or adjusted under 35 U.S.C. 154(b) by 0 days.

(21) Appl. No.: 14/888,244

(22) PCT Filed: Apr. 15, 2014

(86) PCT No.: PCT/JP2014/060694
§ 371 (c)(1),
(2) Date: Oct. 30, 2015

(87) PCT Pub. No.: WO2014/178279
PCT Pub. Date: Nov. 6, 2014

(65) Prior Publication Data
US 2016/0062242 A1    Mar. 3, 2016

(30) Foreign Application Priority Data

May 1, 2013   (JP) .................................. 2013-096179
Mar. 14, 2014 (JP) .................................. 2014-052520

(51) Int. Cl.
*G03F 7/039*   (2006.01)
*G03F 7/038*   (2006.01)
(Continued)

(52) U.S. Cl.
CPC .............. *G03F 7/38* (2013.01); *G03F 7/0046* (2013.01); *G03F 7/039* (2013.01); *G03F 7/0392* (2013.01);
(Continued)

(58) Field of Classification Search
None
See application file for complete search history.

(56) References Cited

U.S. PATENT DOCUMENTS 6,072,006 A * 6/2000 Bantu .................... C08F 261/00
                                                          525/262
8,158,517 B2 * 4/2012 Yamamoto .......... H01L 27/1292
                                                          257/E21.174
(Continued)

FOREIGN PATENT DOCUMENTS

JP    2002-341544 A   11/2002
JP    2003 114525      4/2003
(Continued)

OTHER PUBLICATIONS

Ito et al. "Chemical amplification in the design of dry developing resist materials", Poly. Eng. Sci., vol. 23(18) pp. 1012-1018.*

(Continued)

*Primary Examiner* — Martin Angebranndt
(74) *Attorney, Agent, or Firm* — Oblon, McClelland, Maier & Neustadt, L.L.P.

(57) ABSTRACT

Provided is a method for manufacturing a substrate having a concave pattern to be used for forming a high-definition pattern while suppressing wet-spreading and bleeding of a film-forming ink, provided is a composition to be used for manufacturing the substrate, and provided are a method for forming a conductive film, an electronic circuit, and an electronic device.

The method for manufacturing a substrate having a concave pattern includes: (i) a step of applying, on a substrate 1, a
(Continued)

composition containing a polymer having an acid-dissociable group and an acid generator to form a coating film 2 and (ii) a step of irradiating a predetermined portion of the coating film 2 with radiation. The method for forming a conductive film includes applying a conductive film-forming ink on the concave pattern formed in the exposed portion of the coating film 2 and heating the ink to form a pattern 6. The electronic circuit and the electronic device are provided by using the method for forming a conductive film.

13 Claims, 4 Drawing Sheets

(51) Int. Cl.
- G03F 7/36 (2006.01)
- H05K 1/02 (2006.01)
- H05K 3/12 (2006.01)
- G03F 7/38 (2006.01)
- H05K 3/10 (2006.01)
- G03F 7/004 (2006.01)
- G03F 7/16 (2006.01)
- G03F 7/20 (2006.01)
- H05K 3/28 (2006.01)

(52) U.S. Cl.
CPC .............. *G03F 7/16* (2013.01); *G03F 7/20* (2013.01); *G03F 7/36* (2013.01); *H05K 1/0296* (2013.01); *H05K 3/107* (2013.01); *H05K 3/1208* (2013.01); *H05K 3/287* (2013.01); *H05K 2201/0145* (2013.01); *H05K 2201/0154* (2013.01); *H05K 2201/0166* (2013.01)

(56) References Cited

U.S. PATENT DOCUMENTS

| | | | | |
|---|---|---|---|---|
| 8,877,584 B2* | 11/2014 | Suzuki | ................... | G03F 7/2053 257/E21.412 |
| 2003/0211417 A1* | 11/2003 | Fryd | ................... | G03F 7/0045 430/270.1 |
| 2004/0009430 A1* | 1/2004 | Kanna | ................... | G03F 7/0045 430/287.1 |
| 2004/0103808 A1* | 6/2004 | Lochun | ................... | B41M 1/02 101/483 |
| 2004/0166433 A1* | 8/2004 | Dammel | ............... | G03F 7/0046 430/176 |
| 2005/0112810 A1* | 5/2005 | Kobayashi | ............. | B82Y 30/00 438/182 |
| 2006/0121390 A1* | 6/2006 | Gonsalves | ............ | G03F 7/0397 430/270.1 |
| 2006/0261334 A1* | 11/2006 | Ando | ................... | H01L 27/1292 257/59 |
| 2007/0134420 A1* | 6/2007 | Koberstein | ............. | A61L 27/34 427/258 |
| 2007/0148591 A1* | 6/2007 | Nagahara | .................. | G03F 7/11 430/270.1 |
| 2008/0003509 A1* | 1/2008 | Hirai | ........................ | G03F 1/54 430/5 |
| 2008/0012013 A1* | 1/2008 | Inoue | .................. | H01L 51/0012 257/40 |
| 2012/0082939 A1* | 4/2012 | Kawabata | ............. | C08F 220/38 430/319 |
| 2012/0231396 A1* | 9/2012 | Andou | ....................... | G03F 7/40 430/319 |

FOREIGN PATENT DOCUMENTS

| | | | |
|---|---|---|---|
| JP | 2003 209340 | | 7/2003 |
| JP | 2003-212915 | * | 7/2003 |
| JP | 2003-252928 A | | 9/2003 |
| JP | 2004 98351 | | 4/2004 |
| JP | 2005 202176 | | 7/2005 |
| JP | 2005-345649 | * | 12/2005 |
| JP | 2006 58797 | | 3/2006 |
| JP | 2008-209794 A | | 9/2008 |
| JP | 2008 275949 | | 11/2008 |
| JP | 2011 241309 | | 12/2011 |
| JP | 2012 218318 | | 11/2012 |
| JP | 2012 232434 | | 11/2012 |
| WO | WO 2015/137248 A1 | | 9/2015 |

OTHER PUBLICATIONS

Machine translation of jp 2008-275949 (2008).*
Machine translation of jp 2005-202176 (2005).*
International Search Report Issued May 13, 2014 in PCT/JP2014/060694 filed Apr. 15, 2014.
Extended European Search Report issued Dec. 23, 2016 in Patent Application No. 14791830.4.

* cited by examiner (a)

(b)

US 9,746,775 B2

METHOD FOR MANUFACTURING SUBSTRATE HAVING CONCAVE PATTERN, COMPOSITION, METHOD FOR FORMING CONDUCTIVE FILM, ELECTRONIC CIRCUIT AND ELECTRONIC DEVICE

TECHNICAL FIELD

The present invention relates to a method for manufacturing a substrate having a concave pattern, a composition, a method for forming a conductive film, an electronic circuit, and an electronic device.

BACKGROUND ART

In electronic equipments such as liquid crystal displays, mobile information devices such as mobile phones and tablets, digital cameras, organic EL displays, organic EL lightings, and sensors, in addition to miniaturization and thinning, higher performance has been required. As a method for manufacturing these electronic equipments at lower costs, a printed electronics in which wiring is directly printed has attracted attention. Manufacture of electronic components by a printing method can typically skip a multistage process including exposure and development and a vacuum process such as a vapor deposition method and thus substantial simplification of processes is expected.

Since a printing method such as inkjet or screen printing, gravure printing, or gravure offset printing can form a wiring with a desired pattern directly on a substrate, the method is used as a convenient and low-cost process. However, upon formation of a wiring with a desired pattern, as a result of flowing of a film-forming material used, wet-spreading and bleeding thereof occurs and thus there is a limitation on the formation of a fine pattern excellent in linearity.

Also, a technique of patterning a film-forming material by printing and forming a metal wiring by heat-burning or light-burning has been actively studied (for example, see Patent Document 1). However, in addition to the problem of spreading and bleeding of the material upon printing, there has been a problem in the adhesion of the resulting wiring to the substrate.

Therefore, for solving the aforementioned problems to enable high-definition printing and for forming a high-definition film, a technique of providing a wiring base-serving layer (underlying layer) has been studied. A base treatment for providing the underlying layer is often performed for the purpose of suppressing wet-spreading and bleeding of the film-forming material applied on the substrate to improve printability.

For example, a technique of grafting an epoxy group to a substrate is known (for example, see Patent Documents 2 and 3). Also, a technique of applying a photocatalyst onto a substrate is known (for example, see Patent Documents 4 and 5). Furthermore, a technique of applying an acrylic copolymer onto a substrate is known (for example, see Patent Documents 6 and 7).

RELATED ART DOCUMENTS

Patent Documents

Patent Document 1: JP-A-2011-241309
Patent Document 2: JP-A-2003-114525
Patent Document 3: JP-A-2006-58797
Patent Document 4: JP-A-2003-209340
Patent Document 5: JP-A-2004-98351
Patent Document 6: JP-A-2012-232434
Patent Document 7: JP-A-2012-218318

SUMMARY OF INVENTION

Problems to be Solved by the Invention

However, in the conventional base treatment of providing an underlying layer, the suppression of wet-spreading and bleeding of the film-forming material was insufficient and it was difficult to perform the formation of a high-definition wiring. For example, in the conventional base treatment, the characteristics of the underlying layer surface to be applied with the film-forming material is uniform. Therefore, in the case where the film-forming material is printed in a predetermined pattern, it was impossible to inhibit the material sufficiently from spreading from a state immediately after printing.

The present invention has been made based on the above knowledge. That is, an object of the invention is to provide a method for manufacturing a substrate having an underlying film for forming a high-definition pattern while suppressing wet-spreading and bleeding of a film-forming ink and a composition for use in formation of the underlying film. An object of the invention is to provide a substrate having a concave pattern to be used for forming a high-definition pattern while suppressing wet-spreading and bleeding of a film-forming ink and a method for manufacturing it.

Moreover, an object of the invention is to provide a method for forming a conductive film using the aforementioned method for manufacturing the substrate and is to provide an electronic circuit having the conductive film and an electronic device having the electronic circuit.

Other objects and advantages of the invention will become apparent from the following description.

Means for Solving the Problems

Under such circumstances, as a result of intensive studies for solving the above problems, the present inventors have found that the problems can be solved by a method including specific steps and including no development step, and they have accomplished the present invention.

Example embodiments of the present invention are as follows.

[1] A method for manufacturing a substrate having a concave pattern, which method comprises manufacturing a substrate having a concave pattern while including the following steps of (i) and (ii) and including no development step:

(i) a step of applying a composition containing a polymer having an acid-dissociable group and an acid generator to form a coating film;

(ii) a step of irradiating a predetermined portion of the coating film with radiation.

[2] The method for manufacturing a substrate having a concave pattern described in [1], which further includes a step of heating the coating film after the radiation irradiation.

[3] The method for manufacturing a substrate having a concave pattern described in [1] or [2], wherein the acid-dissociable group contains a fluorine atom.

[4] The method for manufacturing a substrate having a concave pattern described in any one of [1] to [3], wherein a contact angle difference between a radiation-irradiated portion and a radiation-unirradiated portion with respect to tetradecane is 30° or more.

[5] The method for manufacturing a substrate having a concave pattern described in any one of [1] to [4], wherein the concave pattern has film thickness of 10% or more lower than initial film thickness thereof.

[6] The method for manufacturing a substrate having a concave pattern described in any one of 0[1] to [5], wherein the acid-dissociable group is a group containing at least one structural unit selected from the group of an acetal bond and a hemiacetal ester bond.

[7] The method for manufacturing a substrate having a concave pattern described in [6], wherein the group containing at least one structural unit selected from the group of an acetal bond and a hemiacetal ester bond has at least one selected from the group of constitutional units represented by the following formulae (1-1) and (1-2):

[Chem. 1]

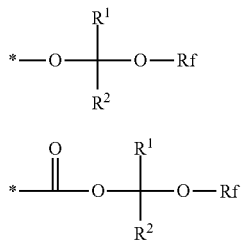

(1-1)

(1-2)

wherein $R^1$ and $R^2$ each independently represent a hydrogen atom or a methyl group and Rf independently represents an organic group having a fluorine atom; and * represents a bonding site.

[8] The method for manufacturing a substrate having a concave pattern described in any one of [1] to [7], wherein the composition contains a polymerizable compound having an ethylenically unsaturated bond.

[9] The method for manufacturing a substrate having a concave pattern described in any one of [1] to [8], wherein the composition has at least one selected from the group of constitutional units represented by the following formulae (2) to (5):

[Chem. 2]

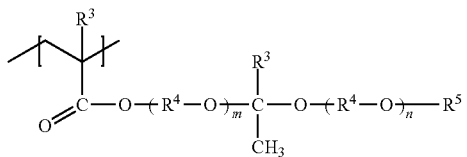

(2)

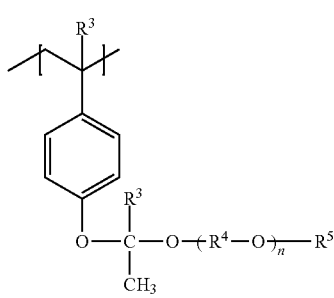

(3)

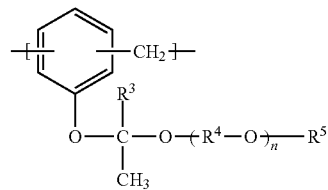

(4)

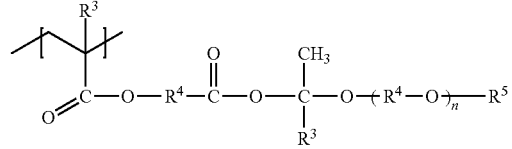

(5)

wherein $R^3$ independently represents a hydrogen atom or a methyl group; $R^4$ independently represents a methylene group, an alkylene group having 2 to 12 carbon atoms, an alkenylene group having 2 to 12 carbon atoms, a substituted or unsubstituted aromatic hydrocarbon group having 6 to 12 carbon atoms, a substituted or unsubstituted alicyclic hydrocarbon group having 4 to 12 carbon atoms, or a group in which one or more hydrogen atoms of each of these groups are substituted with fluorine atom(s); $R^5$ independently represents a hydrocarbon group in which one or more hydrogen atoms are substituted with fluorine atom(s); m represents 0 or 1; and n independently represents from 0 to 12.

[10] A composition, which is used for the method for manufacturing a substrate having a concave pattern described in any one of [1] to [9].

[11] A method for forming a conductive film, which method comprises forming a conductive film, by using a composition for conductive film formation, on the concave pattern formed by the method for manufacturing a substrate having a concave pattern described in any one of [1] to [9].

[12] An electronic circuit, which has a conductive film formed by using the method for forming a conductive film described in [11].

[13] An electronic device, which has the electronic circuit described in [12].

Effects of the Invention

According to the present invention, there are provided a method for manufacturing a substrate having a concave pattern to be used for forming a high-definition pattern while suppressing wet-spreading and bleeding of a film-forming ink, a composition to be used for manufacturing the substrate having a concave pattern, a method for forming a conductive film, an electronic circuit, and an electronic device.

BRIEF DESCRIPTION OF THE DRAWINGS

FIG. 6A is a plan view and FIG. 6B is a cross-sectional view.

EMBODIMENTS FOR CARRYING OUT THE INVENTION

The following will explain embodiments of the invention.

First, the method for forming a concave pattern of the invention will be described and a method for manufacturing a substrate having a concave pattern of the invention will be further described. Thereafter, the composition of the embodiment of the invention, particularly, compounds of the embodiment of the invention, which are suitable as components thereof will be described.

[Method for Manufacturing Substrate Having Concave Pattern]

The method for manufacturing a substrate having a concave pattern of the embodiment of the invention includes the following steps of (i) to (iii) and includes no development step:

(i) a step of applying a radiation-sensitive composition containing a compound having an acid-dissociable group and an acid generator to form a coating film;

(ii) a step of irradiating a predetermined portion of the coating film with radiation;

(iii) a step of heating the coating film after the radiation irradiation.

Using the aforementioned steps of (i) to (ii) (hereinafter also referred to as step (i) and step (ii)) and further the aforementioned step of (iii) (hereinafter also referred to as step (iii)), a concave pattern can be formed without using a development step that is conventionally needed and thus a substrate having a concave pattern can be manufactured.

The following will describe individual steps of the method for manufacturing a substrate having a concave pattern of the embodiment of the invention.

[Step (i)]

Figure 1:
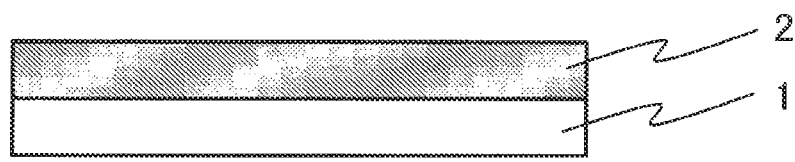
FIG. 1 is a cross-sectional view schematically illustrating a coating film of the radiation-sensitive composition of an embodiment of the invention formed on a substrate.

FIG. 1 is a cross-sectional view schematically illustrating a coating film of the radiation-sensitive composition of an embodiment of the invention formed on a substrate.

The step (i) is a step of forming a coating film 2 on a substrate 1 by applying a composition containing a compound having an acid-dissociable group and an acid generator (hereinafter also referred to as "radiation-sensitive composition") on the substrate and subsequently preferably heating (pre-baking) the coated surface.

In the step (i), concave portions can be formed on the substrate 1 by the use of the radiation-sensitive composition without performing the development process in the following step (iii) or the like.

Incidentally, the radiation-sensitive composition will be specifically described below.

As the material of the substrate 1 which can be used, for example, glass, quartz, silicon, a resin, or the like can be mentioned. Specific examples of the resin include polyethylene terephthalate, polybutylene terephthalate, polyethylene naphthalate, polyether sulfone, polycarbonate, polyimide, a ring-opening polymer of a cyclic olefin (ROMP polymer), and hydrogenated products thereof.

Further, as the substrate 1, since a substrate with a wiring finally obtained by the method for manufacturing a wiring according to the invention is preferably used as it is for electronic circuits and the like, a resin-made substrate, a glass substrate, and a semiconductor substrate, which have been conventionally used for electronic circuits, are preferable.

Incidentally, before applying the radiation-sensitive composition on the substrate 1, the substrate surface may be subjected to pre-treatment(s) such as washing, roughening, and/or impartment of a finely uneven surface.

The method of applying the radiation-sensitive composition is not particularly limited and it is possible to adopt a suitable method such as a coating method using a paintbrush or a brush, a dipping method, a spraying method, a roll coating method, a rotation coating method (spin coating method), a slit die coating method, a bar coating method, flexographic printing, offset printing, inkjet printing, or a dispensing method. Among these coating methods, in particular, a slit die coating method or a spin coating method is preferable.

The thickness of the coating film 2 formed in step (i) may be appropriately adjusted depending on the desired application, but is preferably from 0.1 μm to 20 μm, and more preferably from 0.2 μm to 18 μm.

Conditions for pre-baking vary depending on the composition and the like of the radiation-sensitive composition used, but are preferably from 60° C. to 120° C. and approximately from 1 minute to 10 minutes.

[Step (ii)]

In the step (ii), at least a part of the coating film 2 formed by the step (i) is irradiated with radiation and thus exposed.

Figure 2:
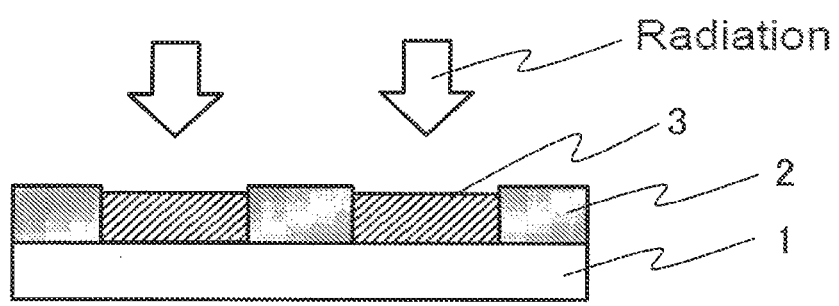
FIG. 2 is a cross-sectional view schematically explaining light exposure of a coating film of the composition of an embodiment of the invention formed on a substrate.

FIG. 2 is a cross-sectional view schematically illustrating light exposure of a coating film of the resin composition of an embodiment of the invention on a substrate.

In the step (ii), as shown in FIG. 2, a part of the coating film 2 on the substrate 1 is irradiated with radiation and a coating film having a radiation-irradiated portion 3 and a radiation-unirradiated portion 2 is formed.

By the step (ii), the acid-dissociable group is eliminated due to the effect of the acid-generator and is evaporated. As a result, the film thickness of the radiation-irradiated portion becomes thinner than the film thickness of the radiation-unirradiated portion and the concave pattern is formed (incidentally, in FIG. 2, the change in the film thickness is not clearly shown). On this occasion, when the acid-dissociable group has a fluorine atom, the coating film obtained in step (i) and the radiation-unirradiated portion exhibit liquid repellency but the radiation-irradiated portion becomes lyophilic as compared with the radiation-unirradiated portion as the acid-dissociable group disappears.

Therefore, in the step (i), in the case of using a composition including a compound containing an acid-dissociable group having a fluorine atom, a coating film having a liquid-repellent radiation-unirradiated portion and a radiation-irradiated portion having a concave pattern that is more lyophilic than the unirradiated portion is formed on the substrate by the step (ii).

In the step (ii), a predetermined pattern can be drawn and exposed through a photomask having a predetermined pattern or using a direct drawing exposure apparatus so that a radiation-irradiated portion having a shape the same as the shape of the wiring to be formed is formed.

In the invention, as the radiation used for exposure, a visible light, an ultraviolet ray, a far ultraviolet ray, a charged particle beam, an X ray, or the like can be used. Among these radiations, radiations in the wavelength range of 190 nm to 450 nm are preferred and, especially radiations including an ultraviolet ray of 365 nm are preferred.

As for the exposure amount in the step (ii), it is preferable to perform exposure to the radiation so that the film thickness of the concave portion obtained after the following step (iii) becomes in the range to be described later. Specifically, the illumination intensity at a wavelength of 365 nm of the radiation is preferably from 10 mJ/cm$^2$ to 1,000 mJ/cm$^2$, more preferably from 20 mJ/cm$^2$ to 500 mJ/cm$^2$ as a value measured by an illuminometer (OAI model 356, manufactured by OAI Optical Associates Inc.).

[Step (iii)]

Figure 3:
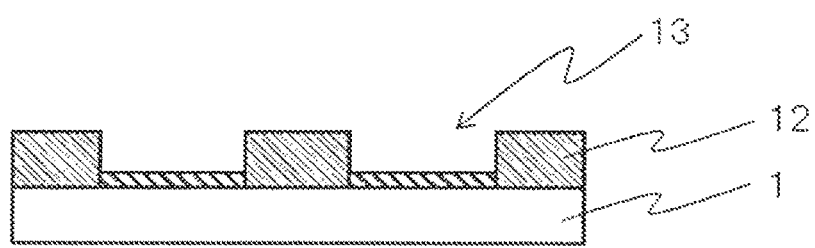
FIG. 3 is a cross-sectional view schematically explaining heating of a coating film of the composition of an embodiment of the invention, a part of which has been exposed to light.

FIG. 3 is a cross-sectional view schematically illustrating heating of a coating film of the resin composition of an embodiment of the invention, a portion of which is exposed.

In the step (iii), by heating the coating film obtained in step (ii), there is formed a coating film having a concave portion 13 corresponding to the portion that is the radiation-irradiated portion at the step (ii) and a convex portion 12 corresponding to the portion that is the radiation-unirradiated portion at the step (ii).

By the step (iii), the component obtained by elimination of the acid-dissociable group by the effect of the acid generator, which component has been generated at the radiation-irradiated portion of the step (ii), can be further evaporated. As a result, a concave depression at the radiation-irradiated portion is further deepened (film thickness of the concave portion 13 is further thinned) and thus there can be formed a coating film having a shape in which the film thickness of the concave portion 13 is 10% or more thinner than the film thickness of the convex portion 12.

In the step (i), in the case of using a composition including a compound containing an acid-dissociable group having a fluorine atom, a coating film having a liquid-repellent convex portion 12 and a concave portion 13 that is more lyophilic than the convex portion is formed on the substrate by the step (iii). Then, when a film-forming material in liquid form is applied on such a coating film, a thickness difference between the convex portion 12 and the concave portion 13 is large, so that the material is easily gathered on the concave portion 13 owing to the unevenness of the coating film surface. Further, not only the effect of the coating film surface shape but also the lyophilicity and liquid repellency of the surface, the material is easily gathered on the concave portion 13 and thus it is facilitated to form a more desirably shaped, specifically a high-definition wiring.

Moreover, in the step (i), in the case of using a composition including a compound containing an acid-dissociable group having a fluorine atom, a group having a fluorine atom is eliminated by the radiation irradiation. Since the leaving group is relatively easy to evaporate, in the step (iii), a coating film having a large film thickness difference between the convex portion 12 and the concave portion 13 can be formed more conveniently.

As a method of heating the coating film in the step (iii), for example, there may be mentioned a method of heating the substrate with the coating film using a hot plate, a batch oven, or a conveyor oven, a method of hot-air drying using a drier or the like, and a method of vacuum baking.

The conditions for the heating vary depending on the composition of the radiation-sensitive composition used in the step (i), the thickness of the coating film obtained in the step (ii), and the like, but the conditions are preferably from 60° C. to 150° C. and approximately from 3 minutes to 30 minutes.

In the step (iii), it is desirable to form a coating film having a shape in which the film thickness of the concave portion 13 is preferably 10% or more thinner, more preferably 11% or more thinner, further preferably 12% to 70% thinner than the above concave portion. When the resulting coating film has such a shape, at the time of applying the film-forming material to the concave portion 13, the material is less likely to overflow from the concave portion 13 owing to the uneven difference in the level of the coating film surface, and the material is less likely to remain in a position other than the concave portion 13, so that a large amount of the film-forming material can be applied and also a high-definition wiring can be obtained even when a large amount of the wiring material is used.

The thickness of the concave portion 13 and the convex portion 12 can be specifically measured by the method described in Examples to be described below.

Incidentally, the thickness of the concave portion 13 obtained in the step (iii) may be appropriately adjusted depending on the desired application but is preferably from 0.01 μm to 18 μM, more preferably from 0.05 μm to 15 μm.

A contact angle difference, with respect tetradecane, between the surface of the concave portion 13 and the surface of the convex portion 12 (contact angle of surface of the convex part 12—contact angle of surface of the concave portion 13) is preferably 30° or more, more preferably 40° or more, and even more preferably 50° or more. When the contact angle difference is in the above range, in the following step (iv), even in the case where the film-forming material in a liquid form is also applied to the surface of the convex portions 12, the material are repelled on the convex portion 12 that is a liquid-repellent portion and thus the material is easily moved to the concave portion 13 that is a lyophilic portion, so that it becomes possible to form a wiring along the concave portion 13.

The contact angle difference can be specifically measured by the method described in Examples to be described below.

Incidentally, the surface of the concave portion 13 and the surface of the convex portions 12 mean, as shown in FIG. 3, the surface of the coating film formed on the substrate 1, which surface is opposite to the side in contact with the substrate 1.

When the resulting concave portion 13 and convex portion 12 satisfy the requirements that the film thickness of the concave portion 13 is 10% or more thinner than the film thickness of the convex portion 12 and the contact angle difference, with respect tetradecane, between the surface of the concave portion 13 and the surface of the convex portion 12 is 30° or more, it becomes possible to easily apply a large amount of the film-forming material only on the concave portion 13, for the same reasons as described above.

[Method for Forming Film on Concave Portion]

The manufacturing method according to the invention includes a method for forming a film on concave portion 13 obtained in the step (iii).

[Step (iv)]

Figure 4:
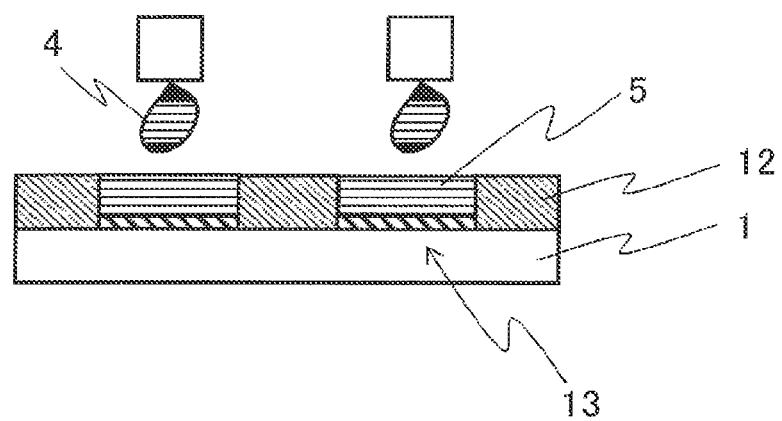
FIG. 4 is a cross-sectional view schematically explaining application of a film-forming material in the method for forming a film of an embodiment of the invention.

FIG. 4 is a cross-sectional view schematically explaining application of a film-forming material in the film forming method of an embodiment of the invention.

In the step (iv), a film-forming material 4 is applied on the concave portion 13.

Incidentally, the film-forming material 4 will be specifically described below.

The application method is not particularly limited and it is possible to adopt a suitable method such as a coating method using a paintbrush or a brush, a dipping method, a spraying method, a roll coating method, a rotation coating method (spin coating method), a slit die coating method, a bar coating method, a squeegee method, flexo printing, offset printing, inkjet printing, or a dispensing method. Of these, especially, a dipping method, a spraying method, a spin coating method, a slit die coating method, an offset printing method, inkjet printing, and a dispensing method are preferable.

Also, from the viewpoint of forming a wiring which is fine and thick, has low resistance, and is hardly broken, offset printing is preferred. Offset printing can be, for example, performed on the basis of the descriptions of JP-A-2010-159350 and JP-A-2011-178006.

Since the coating film 5 of the film-forming material 4 obtained in the above step (iii) has a liquid-repellent convex portion 12 and a concave portion 13 that is more lyophilic than the portion, in the case of using the film-forming material 4 in a liquid form, the material is repelled on the convex portion 12 and is likely to gather on the concave portion 13 even using any of the methods described above, so that the film-forming material 4 becomes in a state of being applied along the concave portion 13.

[Step (v)]

In the step (v), the substrate with the film-forming material obtained in the step (iv) is heated.

Figure 5:
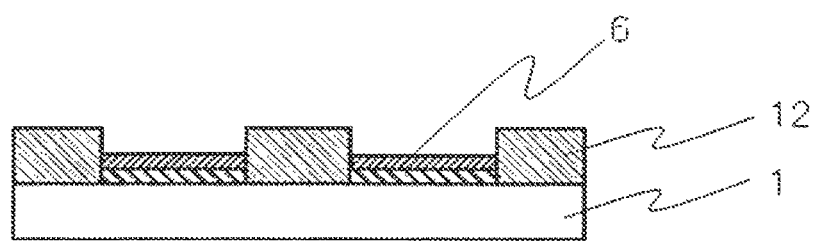
FIG. 5 is a cross-sectional view schematically illustrating a pattern of an embodiment of the invention formed on a substrate.

FIG. 5 is a cross-sectional view schematically showing a pattern of an embodiment of the invention formed on a substrate.

By this step (v), a pattern 6 is formed.

The temperature for the heating is not particularly limited but is preferably 190° C. or lower. Moreover, in the case of using a poorly heat-resistant film such as polyethylene terephthalate as the substrate 1, the temperature is preferably the heat resistance temperature of the film or lower, specifically 150° C. or lower.

Also, the heating time is not particularly limited but is preferably from 1 minute to 120 minutes, and more preferably from 3 minutes to 60 minutes.

As a method for the heating, for example, a method of heating with a hot plate, a batch oven, or a conveyor oven, a method of hot-air drying using a dryer or the like, and a method of vacuum baking may be mentioned.

[Method for Forming Conductive Pattern]

In the invention, a conductive film of the invention can be formed by a similar method to the film forming method of embodiments of the invention described above by using the substrate formed by the steps (i), (ii), and (iii) of the method of manufacturing a substrate having a concave pattern which is an embodiment of the invention and using a conductive film-forming ink or a conductive film-forming paste as the film-forming material. That is, using the substrate having a concave pattern of the invention described above, a conductive pattern of the invention can be formed as the conductive film of the invention by implementing a method of applying a conductive film-forming ink on the concave pattern and a method of performing conductive film formation on the concave pattern.

Moreover, the conductive pattern of the present embodiment formed on the film of the radiation-sensitive composition of the embodiment is also excellent in characteristics such as conductivity and adhesiveness and is effective in forming a high-definition wiring or electrode.

Also, the pattern of the conductive pattern or the like of the present embodiment can be suitably used, as the conductive film of an embodiment of the invention, for formation of the electronic circuit of the embodiment of the invention. That is, the electronic circuit of an embodiment of the invention is configured with a pattern of the conductive pattern or the like of the embodiment of the invention.

[Electronic Circuit and Electronic Device]

The electronic circuit of the invention has the wiring manufactured by the method for forming the conductive pattern and preferably has a laminate of the wiring and the substrate manufactured by the method for forming the conductive pattern.

Moreover, the electronic device of the invention has the electronic circuit. Therefore, the device becomes a miniaturized, thinned, and highly functionalized electronic device.

Examples of the electronic device include liquid crystal displays, portable information devices such as mobile phones, digital cameras, organic displays, organic EL lighting, and a variety of sensors and wearable devices.

[Radiation-Sensitive Composition]

The radiation-sensitive composition of the embodiment of the invention is suitably used for the method for manufacturing a substrate having a concave pattern of the embodiment of the invention.

The radiation-sensitive composition (hereinafter sometimes simply referred to as composition) of the embodiment of the invention contains a compound having an acid-dissociable group of the embodiment of the present invention (hereinafter sometimes simply referred to as [A] compound).

The composition of the present embodiment can contain a solvent in addition to [A] compound. Moreover, the composition of the present embodiment may contain an acid generator. Furthermore, the compositions of the embodiment may contain a polymerizable compound having an ethylenically unsaturated bond, and can contain a radiation-sensitive polymerization initiator.

The composition of the embodiment exhibits a liquid form when it contains a solvent (hereinafter sometimes referred to as [B] solvent) and forms a coating film by coating, so that an underlying layer can be easily formed.

Moreover, the composition of the embodiment can have a desired highly sensitive radiation sensitivity when it contains an acid generator (hereinafter sometimes referred to as [C] acid generator). Also, the composition may contain a sensitizer (hereinafter sometimes referred to as [D] sensitizer) as an auxiliary material for the acid generator. Furthermore, the composition can contain a quencher (hereinafter sometimes referred to as [E] quencher) as a diffusion suppressing material of an acid from the acid generator.

Furthermore, the composition of the embodiment can contain a polymerizable compound having an ethylenically unsaturated bond (hereinafter sometimes referred to as [F] polymerizable compound). Moreover, the composition of the embodiment can contain a radiation-sensitive polymerization initiator (hereinafter sometimes referred to as [G] radiation-sensitive polymerization initiator).

In addition, the composition can contain other optional components as long as the effects of the invention are not impaired.

The viscosity of the composition (temperature: 20° C., shear rate: 10 sec$^{-1}$) may be adjusted depending on the desired coating method and the film thickness and the like of the desired coating film. In the case of forming a coating film having a film thickness of 0.5 μm to 2 μm and in the case of using a spin coating method as the coating method, from 5 cP (0.003 Pa·S) to 20 cP (0.02 Pa·S) can be preferably exemplified and, in the case of using a slit die coating method as the coating method, from 1 cP (0.001 Pa·S) to 20 cP (0.01 Pa·S) can be preferably exemplified.

<[A] Compound Having Acid-Dissociable Group>

[A] Compounds having an acid-dissociable group ([A] compound) to be a component of the radiation-sensitive composition of the present embodiment has a group containing at least one structural unit selected from the group of an acetal bond and a hemiacetal ester bond. More specifically, it preferably contains a structural unit represented by the following formula (1-1) or (1-2).

[Chem. 3]

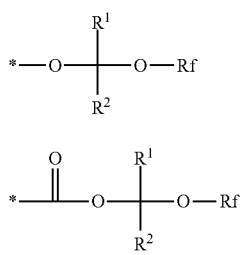

(1-1)

(1-2)

wherein $R^1$ and $R^2$ each independently represent a hydrogen atom or a methyl group and Rf independently represents an organic group substituted with a fluorine atom; * represents a bonding site.

The compound containing an acetal bond can be obtained by reacting an alcohol with a compound having a group $CH_2=C(R_1)-O-$ and the compound containing a hemiacetal ester bond can be obtained by reacting a carboxylic acid with a compound having a group $CH_2=C(R_1)-O-$.

As the Rf, an organic group having a fluorine atom can be mentioned.

As the Rf, groups represented by the following formulas (1-1-1) to (1-1-33) are preferable.

[Chem. 4]

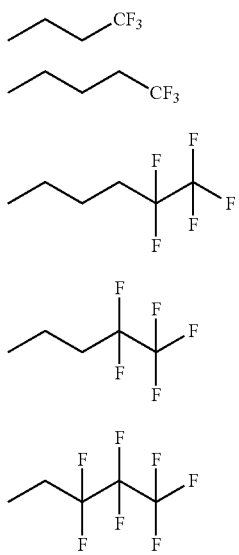

(1-1-1)
(1-1-2)
(1-1-3)
(1-1-4)
(1-1-5)

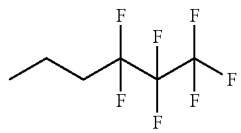
(1-1-6)

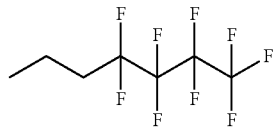
(1-1-7)

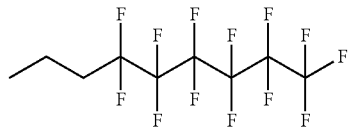
(1-1-8)

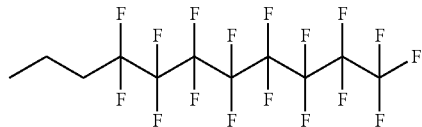
(1-1-9)

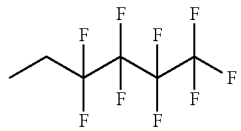
(1-1-10)

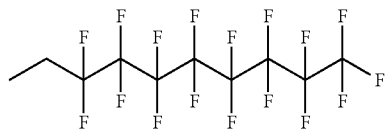
(1-1-11)

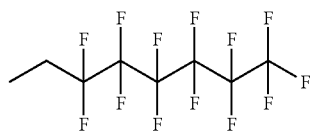
(1-1-12)

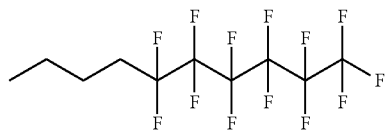
(1-1-13)

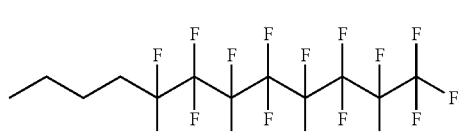
(1-1-14)

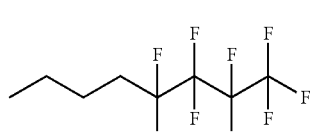
(1-1-15)

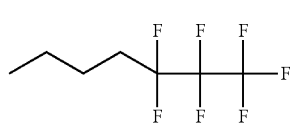
(1-1-16)

(1-1-17)
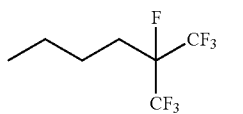
(1-1-18)
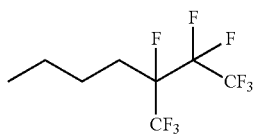
(1-1-19)
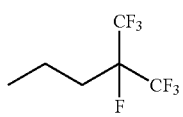
(1-1-20)
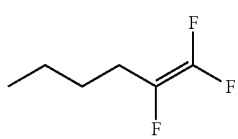
[Chem. 5]
(1-1-21)
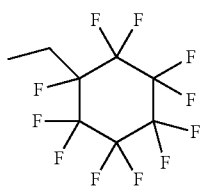
(1-1-22)
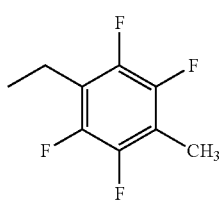
(1-1-23)
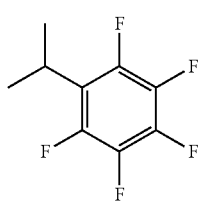
(1-1-24)
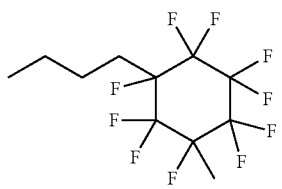
(1-1-25)
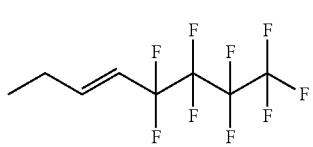
(1-1-26)
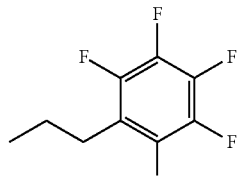
(1-1-27)
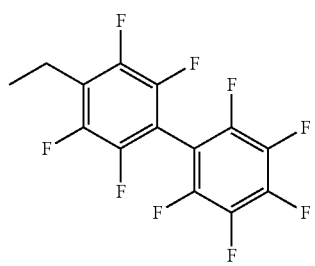
(1-1-28)
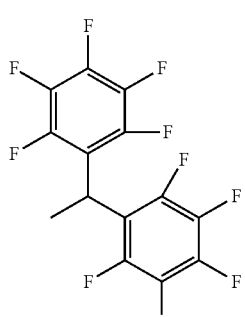
(1-1-29)
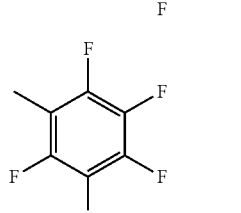
(1-1-30)
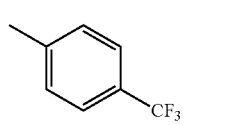
(1-1-31)
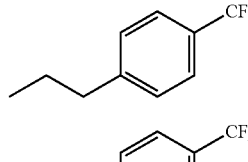
(1-1-32)
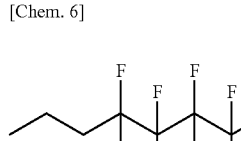
[Chem. 6]
(1-1-33)
[A] Compound is preferably a compound having a structure resulting from the introduction of a protecting group derived from a vinyl ether compound represented by the following formula (1) (hereinafter sometimes referred to as "compound (1)") into the hydroxyl group of a compound having a hydroxyl group as a precursor. Furthermore, [A] compound may be a compound having a structure resulting from the introduction of a protecting group derived from the compound (1) into the carboxyl group of a compound having a carboxyl group as a precursor.

These compounds (hereinafter sometimes referred to as "compound (a)"), especially the compound having a hydroxyl group as a precursor, have a property that elimination of the protecting group by heat is less likely to occur and, on the other hand, have a property that the elimination of the protecting group by radiation irradiation can be controlled, so that the compounds can be suitably used as [A] compounds. Furthermore, these compounds are preferable, since it becomes possible to control the elimination of the protecting group with higher accuracy by combining them with [C] acid generator to be described later.

[Chem. 7]

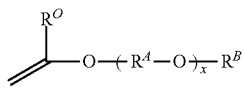

(1)

In the above formula (1), $R^O$ represents a hydrogen atom or a methyl group.

In the formula (1), $R^A$ independently represents a methylene group, an alkylene group having 2 to 12 carbon atoms, an alkenylene group having 2 to 12 carbon atoms, a substituted or unsubstituted aromatic hydrocarbon group having 6 to 13 carbon atoms, a substituted or unsubstituted alicyclic hydrocarbon group having 4 to 12 carbon atoms, or a group in which one or more hydrogen atoms of the group are substituted with fluorine atom(s).

As the alkylene group having 2 to 12 carbon atoms in $R^A$ of the formula (1), there are mentioned an ethylene group, a propylene group, a butylene group, a pentylene group, a hexylene group, a heptylene group, an octylene group, a nonylene group, a decylene group, an undecylene group, a dodecylene group, and the like.

As the alkenylene group having 2 to 12 carbon atoms in $R^A$ of the formula (1), there are mentioned a vinylene group, an ethene-1,2-diyl group, a 2-butene-1,4-diyl, and the like.

As the substituted or unsubstituted aromatic hydrocarbon group having 6 to 13 carbon atoms in $R^A$ of the formula (1), there are mentioned a phenylene group, a tolylene group, a mesitylene group, a naphthylene group, and a biphenylene group.

As the substituted or unsubstituted alicyclic hydrocarbon group having 4 to 12 carbon atoms in $R^A$ of the formula (1), there are mentioned (a cyclobutyl group, a cyclopentyl group, a cyclohexyl group, a cycloheptyl group, and a bicyclohexyl group).

As the group in which one or more hydrogen atoms of the methylene group, the alkylene group having 2 to 12 carbon atoms, the alkenylene group having 2 to 12 carbon atoms, the substituted or unsubstituted aromatic hydrocarbon group having 6 to 13 carbon atoms, or the substituted or unsubstituted alicyclic hydrocarbon group having 4 to 12 carbon atoms are substituted with fluorine atom(s) in $R^A$ of the formula (1), there are mentioned groups in which one or more hydrogen atoms of any of the groups exemplified above are substituted with fluorine atom(s).

$R^A$ of the above formula (1) is preferably a methylene group, an ethylene group, a propylene group, a butylene group, a pentamethylene group, a hexamethylene group, a phenylene group, or a vinylene group.

In the above formula (1), $R^B$ represents a group in which one or more hydrogen atoms of a hydrocarbon group is substituted with fluorine atom(s).

In the above formula (1), as $R^B$, there are mentioned, for example, groups represented by the above formulae (1-1-1) to (1-1-33), a 2,2,2-trifluoroethyl group, a 4,4,5,5,6,6,6,-heptafluorohexyl group, and a 1,2,2-trifluorovinyl group, and a 2,2,2-trifluoroethyl group, a 3,3,3-trifluoropropyl group of the formula (1-1-1), a 4,4,4-trifluoro-butyl group of the formula (1-1-2), a 3,3,4,4,4-pentafluorobutyl group of the formula (1-1-4), a 4,4,5,5,6,6,6-heptafluorohexyl group, a 3,3,4,4,5,5,6,6,7,7,8,8,8-tridecafluorooctyl group of the formula (1-1-8), a 1,2,2-trifluorovinyl group, and a 2,3,4,5,6-pentafluorophenyl group of the formula (1-1-29) are preferable.

In the above formula (1), x represents an integer of 0 to 12, preferably an integer of 0 to 9, 0 being more preferred.

The coating film formed by the aforementioned steps (i) exhibits characteristics based on [A] compound, and, in the case of using the compound (a) as [A] compound, the coating film exhibits characteristics derived from the protecting group of the compound (a). Specifically, when a coating film is formed from a radiation-sensitive composition containing the compound (a), first, a liquid-repellent coating film is formed in the step (i) and, when the coating film is irradiated with radiation, elimination of the protecting group occurs at the exposed portion and, at the portion where the protecting group is eliminated, a hydroxyl group remains and liquid repellency owing to the protecting group is lost.

Then, a method for obtaining [A] compound, specifically [A] compound that is a polymer (hereinafter sometimes referred to as [A] polymer) will be described. As the method for obtaining [A] compound that is the polymer ([A] polymer), it is possible to apply two methods, i.e., a method of using a polymer as a compound to be a precursor and a method of using a monomer as a compound to be a precursor.

In the method of using a polymer as a compound to be a precursor, the polymer to be a precursor contains a hydroxyl group or a carboxyl group in the molecule and [A] polymer can be obtained by reacting the compound (1) with the hydroxyl group of the polymer to be a precursor.

Moreover, in the method of using a monomer as a compound to be a precursor, the monomer to be a precursor contains a hydroxyl group or a carboxyl group in the molecule, and [A] polymer can be obtained by reacting the compound (1) with the hydroxyl group or carboxyl group of the monomer to be a precursor and subsequently polymerizing the resulting monomer.

The following will more specifically describe two methods for obtaining [A] polymer.

(1) Method of Using Polymer as Compound to be Precursor

In the method, a monomer having a hydroxyl group or a carboxyl group is polymerized to obtain a polymer (precursor) having a hydroxyl group or a carboxyl group and subsequently the compound (1) is reacted with the hydroxyl group or carboxyl group of the polymer to be a precursor, thereby obtaining [A] polymer.

The monomer having a hydroxyl group is preferably a (meth)acrylic acid ester and examples thereof may include 2-hydroxyethyl methacrylate, 2-hydroxypropyl methacrylate, 2-hydroxyethyl acrylate, 2-hydroxypropyl acrylate, 2-hydroxybutyl methacrylate, 2-hydroxybutyl acrylate, 2-hydroxy-3-phenoxypropyl acrylate, 2-acryloyloxyethyl-2-hydroxyethyl phthalate, dipropylene glycol methacrylate, dipropylene glycol acrylate, 4-hydroxybutyl methacrylate, 4-hydroxybutyl acrylate, cyclohexanedimethanol monoacrylate, cyclohexanedimethanol monomethacrylate, ethyl α-(hydroxymethyl)acrylate, polypropylene glycol monomethacrylate, polypropylene glycol monoacrylate, glycerol monomethacrylate, glycerol monoacrylate, polyethylene glycol monomethacrylate, polyethylene glycol monoacrylate, poly(ethylene glycol-propylene glycol)monomethacrylate, poly(ethylene glycol-propylene glycol)monoacrylate, polyethylene glycol-polypropylene glycol monomethacrylate, polyethylene glycol-polypropylene glycol monoacrylate, poly(ethylene glycol-tetramethylene glycol)monomethacrylate, poly(ethylene glycol-tetramethylene glycol)monoacrylate, poly(propylene glycol-tetramethylene glycol)monomethacrylate, poly(propylene glycol-tetramethylene glycol)monoacrylate, propylene glycol polybutylene glycol monomethacrylate, propylene glycol polybutylene glycol monoacrylate, p-hydroxyphenyl methacrylate, and para-hydroxyphenyl acrylate, and also there may be mentioned the following PLACCEL FM1, PLACCEL FM1D, PLACCEL FM2D, PLACCEL FM3, PLACCEL FM3X, PLACCEL FM4, PLACCEL FM5, PLACCEL FA1, PLACCEL FA1DDM, PLACCEL FA2D, PLACCEL FA5, and PLACCEL FA10L manufactured by Daicel Corporation.

As the monomer having a carboxyl group described above, there may be mentioned acrylic acid, methacrylic acid, 2-acryloyloxyethylsuccinic acid, 2-methacryloyloxyethylsuccinic acid, 2-acryloyloxyethylphthalic acid, 2-methacryloyloxyethylphthalic acid, 2-acryloyloxyethyltetrahydrophthalic acid, 2-methacryloyloxyethyltetrahydrophthalic acid, 2-acryloyloxyethylhexahydrophthalic acid, 2-methacryloyloxyethylhexahydrophthalic acid, 2-acryloyloxypropylphthalic acid, 2-methacryloyloxypropylphthalic acid, 2-acryloyloxypropyltetrahydrophthalic acid, 2-methacryloyloxypropyltetrahydrophthalic acid, 2-acryloyloxypropylhexahydrophthalic acid, and 2-methacryloyloxypropylhexahydrophthalic acid.

The polymer having a hydroxyl group or a carboxyl group to be a precursor of [A] polymer can be obtained using only the monomer having a hydroxyl group or a carboxyl group described above and also can be obtained by copolymerizing a monomer having a hydroxyl group or carboxyl group described above and a monomer other than the monomer having a hydroxyl group or a carboxyl group. As the monomer other than the monomer having a hydroxyl group or a carboxyl group, there may be mentioned (meth)acrylic acid linear alkyl esters, (meth)acrylic acid cyclic alkyl esters, (meth)acrylic acid aryl esters, unsaturated aromatic compounds, conjugated dienes, unsaturated compounds containing a tetrahydrofuran skeleton, maleimides, monomers other than these, and the like.

When more specifically described, examples of the aforementioned (meth)acrylic acid linear alkyl esters include methyl methacrylate, ethyl methacrylate, n-butyl methacrylate, sec-butyl methacrylate, t-butyl methacrylate, 2-ethylhexyl methacrylate, isodecyl methacrylate, n-lauryl methacrylate, tridecyl methacrylate, n-stearyl methacrylate, methyl acrylate, ethyl acrylate, n-butyl acrylate, sec-butyl acrylate, t-butyl acrylate, 2-ethylhexyl acrylate, isodecyl acrylate, n-lauryl acrylate, tridecyl acrylate, n-stearyl acrylate, and the like.

Further, examples of the aforementioned (meth)acrylic acid cyclic alkyl esters include cyclohexyl methacrylate, 2-methylcyclohexyl methacrylate, tricyclo[$5.2.1.0^{2,6}$]decan-8-yl methacrylate, isobornyl methacrylate, cyclohexyl acrylate, 2-methylcyclohexyl acrylate, tricyclo[$5.2.1.0^{2,6}$]decan-8-yl acrylate, isobornyl acrylate, and the like.

Moreover, examples of the aforementioned (meth)acrylic acid aryl esters include phenyl methacrylate, benzyl methacrylate, phenyl acrylate, and benzyl acrylate.

Further, examples of the aforementioned unsaturated aromatic compounds include styrene, α-methylstyrene, o-methylstyrene, m-methylstyrene, p-methylstyrene, and p-methoxystyrene.

Furthermore, examples of the aforementioned conjugated dienes include 1,3-butadiene, isoprene, and 2,3-dimethyl-1,3-butadiene.

Moreover, the aforementioned unsaturated compound containing a tetrahydrofuran skeleton include tetrahydrofurfuryl(meth)acrylate, 2-methacryloyloxy-propionic acid tetrahydrofurfuryl ester, and 3-(meth)acryloyloxytetrahydrofuran-2-one.

Further, examples of the aforementioned maleimides include N-phenylmaleimide, N-cyclohexylmaleimide, N-tolylmaleimide, N-naphthylmaleimide, N-ethylmaleimide, N-hexylmaleimide, and N-benzylmaleimide.

Furthermore, examples of the other monomers include glycidyl methacrylate, 3,4-epoxycyclohexyl methacrylate, 3,4-epoxycyclohexyl acrylate, 3-(methacryloyloxymethyl)-3-ethyloxetane, 3-(acryloyloxymethyl)-3-ethyloxetane, tricyclo[$5.2.1.0^{2,6}$]decan-8-yloxyethyl methacrylate, and tricyclo[$5.2.1.0^{2,6}$]decan-8-yloxyethyl acrylate.

Examples of the solvent to be used in the polymerization reaction for synthesizing the polymer having a hydroxyl group or a carboxyl group to be a precursor of [A] polymer include alcohols, glycol ethers, ethylene glycol alkyl ether acetates, diethylene glycol monoalkyl ethers, diethylene glycol dialkyl ethers, dipropylene glycol dialkyl ethers, propylene glycol monoalkyl ethers, propylene glycol alkyl ether acetates, propylene glycol monoalkyl ether propionates, ketones, and esters.

In the polymerization reaction for obtaining the polymer having a hydroxyl group or a carboxyl group to be a precursor of [A] polymer, in order to regulate the molecular weight, it is possible to use a molecular weight regulator. Examples of the molecular weight regulator include halogenated hydrocarbons such as chloroform and carbon tetrabromide; mercaptans such as n-hexylmercaptan, n-octylmercaptan, n-dodecylmercaptan, t-dodecylmercaptan, and thioglycolic acid; xanthogens such as dimethyl xanthogen sulfide and diisopropyl xanthogen disulfide; terpinolene, and α-methylstyrene dimer.

Weight-average molecular weight (Mw) of the polymer having a hydroxyl group or a carboxyl group in terms of polystyrene by gel permeation chromatography (GPC) is preferably from 1,000 to 30,000, more preferably 5,000 to 20,000. By controlling Mw of the polymer having a hydroxyl group or a carboxyl group to the aforementioned range, it is possible to increase the sensitivity of the radiation-sensitive composition containing it as [A] compound.

Then, the method of reacting the compound (1) with the hydroxyl group or the carboxyl group of the polymer having a hydroxyl group or a carboxyl group to obtain [A] compound can be carried out by adding a vinyl ether group to the hydroxyl group or the carboxyl group, as represented by the following formula.

[Chem. 8]

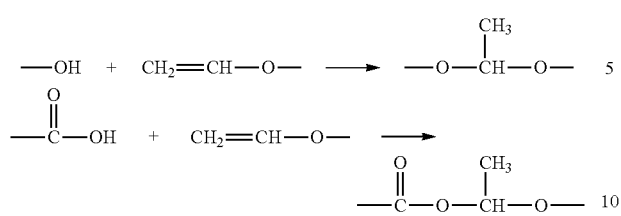

For the method for obtaining [A] compound, a known method can be consulted and, for example, the method described in JP-A-2005-187609 can be used as a reference.

Specifically, an adduct is formed by generating an acetal bond from the hydroxyl group of the polymer having a hydroxyl group with the vinyl ether group of the compound (1) or by generating a hemiacetal ester bond from the carboxyl group of the monomer having a carboxyl group with the vinyl ether group of the compound (1).

For example, after the polymer having a hydroxyl group or a carboxyl group is dissolved in a suitable organic solvent, the compound (1) is added in an amount equimolar or excess to the hydroxyl group or the carboxyl group possessed by the polymer and the resultant reaction mixture is cooled to a temperature of 0° C. to about room temperature (25° C.). Thereafter, an acid dissolved in the same solvent as the aforementioned organic solvent (e.g., an oxalic acid solution) is added dropwise as a catalyst and, after completion of the dropwise addition, the mixture is stirred at room temperature for 1 hour to 24 hours and thus reacted. After completion of the reaction, objective [A] compound can be obtained by removing the organic solvent.

(2) Method of Using Monomer as Compound to be Precursor

In this method, [A] compound is obtained by reacting the compound (1) with the hydroxyl group or carboxyl group of the monomer having a hydroxyl group or a carboxyl group to obtain an adduct, followed by polymerization. For a method of obtaining such [A] compound, a known method can be used as a reference. For example, as described in JP-A-2005-187609, an adduct is formed by generating an acetal bond from the hydroxyl group of the monomer having a hydroxyl group with the vinyl ether group of the vinyl ether compound or by generating a hemiacetal ester bond from the carboxyl group of the monomer having a carboxyl group with the vinyl ether group of the compound (1). Then, using the resulting monomer, it is possible to obtain [A] compound in the same manner as the aforementioned method for manufacturing a polymer having a hydroxyl group or a carboxyl group.

As preferred examples of [A] compound obtained as above, polymers having at least one selected from the group consisting of constitutional units represented by the following formulae (2) to (5) may be mentioned.

[Chem. 9]

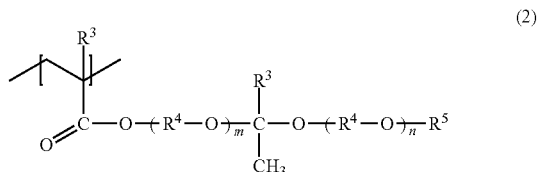

(2)

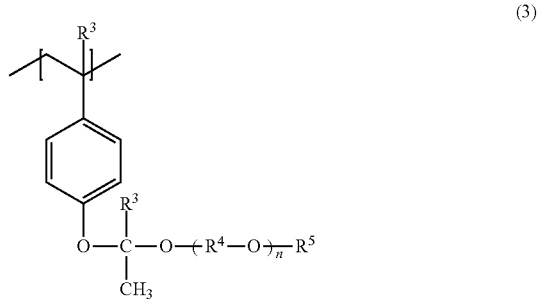

(3)

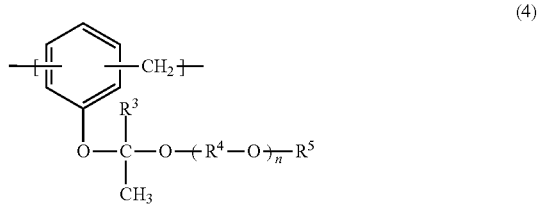

(4)

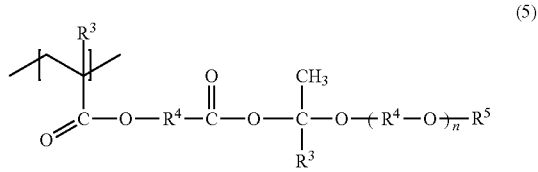

(5)

wherein $R^3$ independently represents a hydrogen atom or a methyl group; $R^4$ independently represents a methylene group, an alkylene group having 2 to 12 carbon atoms, an aromatic hydrocarbon group having 6 to 13 carbon atoms, a substituted or unsubstituted alicyclic hydrocarbon group having 4 to 12 carbon atoms, or a group in which one or more hydrogen atoms of each of these groups are substituted with fluorine atom(s); $R^5$ independently represents a group in which one or more hydrogen atoms of a hydrocarbon group are substituted with fluorine atom(s); m represents 0 or 1; and n independently represents from 0 to 12.

[Chem. 10]

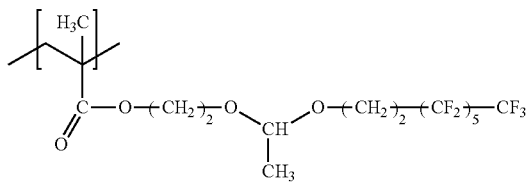

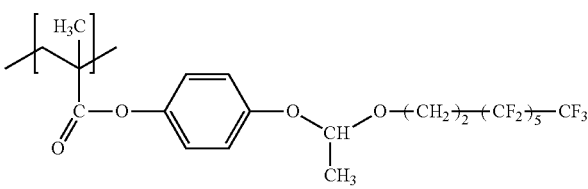

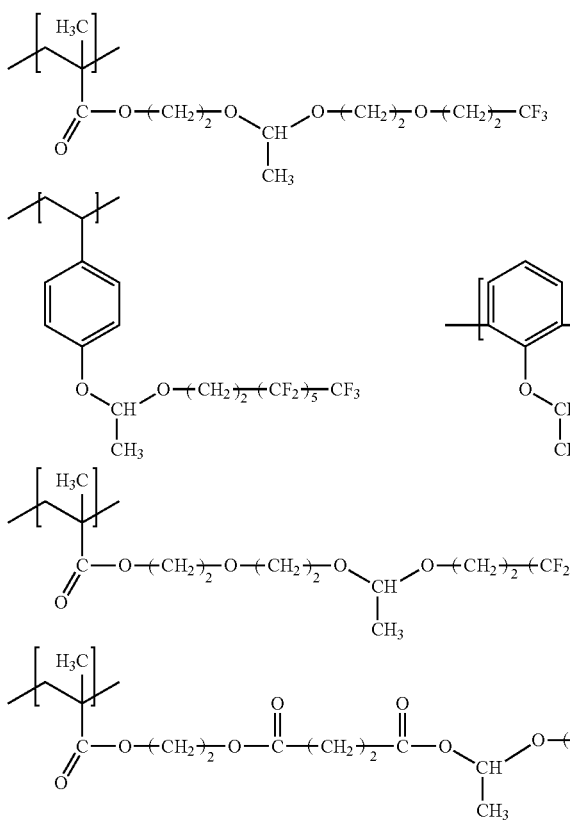
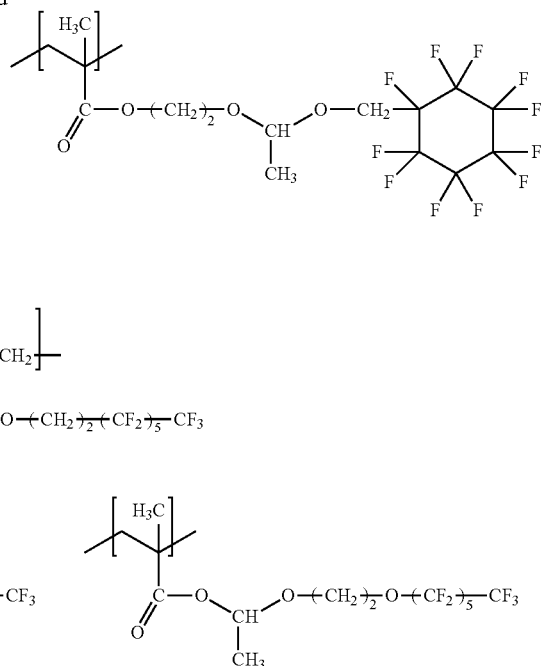

[A] compounds may be used singly or may be used as a mixture of two or more thereof.

<[B] Solvent>

[B] Solvent is not particularly limited but is preferably a solvent which can homogeneously dissolve or disperse individual components such as [C] acid generator and [F] polymerizable compound in addition to [A] compound.

As suitable [B] solvent, there may be mentioned alcohol-based solvents, ethers, diethylene glycol alkyl ethers, ethylene glycol alkyl ether acetates, propylene glycol monoalkyl ether acetates, propylene glycol monoalkyl ether propionates, aliphatic hydrocarbons, aromatic hydrocarbons, ketones, esters, and the like.

As the aforementioned alcohol-based solvents, there may be mentioned long-chain alkyl alcohols such as 1-hexanol, 1-octanol, 1-nonanol, 1-dodecanol, 1,6-hexanediol, and 1,8-octanediol;

aromatic alcohols such as benzyl alcohol;

ethylene glycol monoalkyl ethers such as ethylene glycol monomethyl ether, ethylene glycol monoethyl ether, ethylene glycol monopropyl ether, and ethylene glycol monobutyl ether;

propylene glycol monoalkyl ethers such as propylene glycol monomethyl ether, propylene glycol monoethyl ether, propylene glycol monopropyl ether, and propylene glycol monobutyl ether; and dipropylene glycol monoalkyl ethers such as dipropylene glycol monomethyl ether, dipropylene glycol monoethyl ether, dipropylene glycol monopropyl ether, and dipropylene glycol monobutyl ether. These alcohol-based solvents may be used singly or in combination of two or more thereof.

Of these alcohol-based solvents, especially in view of coating property improvement, benzyl alcohol, ethylene glycol monopropyl ether, ethylene glycol monobutyl ether, propylene glycol monomethyl ether, and propylene glycol monoethyl ether are preferable.

Examples of the aforementioned ethers may include tetrahydrofuran, hexyl methyl ether, triethylene glycol dimethyl ether, triethylene glycol diethyl ether, and 1,4-dioxane.

Examples of the aforementioned diethylene glycol alkyl ethers may include diethylene glycol dimethyl ether, diethylene glycol diethyl ether, diethylene glycol ethyl methyl ether, and the like.

Examples of the aforementioned ethylene glycol alkyl ether acetates may include methyl cellosolve acetate, ethyl cellosolve acetate, ethylene glycol monobutyl ether acetate, ethylene glycol monoethyl ether acetate, and the like.

Examples of the aforementioned propylene glycol monoalkyl ether acetates may include propylene glycol monomethyl ether acetate, propylene glycol monoethyl ether acetate, propylene glycol monopropyl ether acetate, and propylene glycol monobutyl ether acetate.

Examples of the aforementioned propylene glycol monoalkyl ether propionates may include propylene glycol monomethyl ether propionate, propylene glycol monoethyl ether propionate, propylene glycol monopropyl ether propionate and propylene glycol monobutyl ether propionate.

Examples of the aforementioned aliphatic hydrocarbons may include n-pentane, n-hexane, n-heptane, n-octane, n-nonane, n-decane, n-undecane, n-dodecane, cyclohexane, and decalin.

Examples of the aforementioned aromatic hydrocarbons may include benzene, toluene, xylene, ethylbenzene, n-propylbenzene, i-propylbenzene, n-butylbenzene, mesitylene, chlorobenzene, and dichlorobenzene.

Examples of the aforementioned ketones may include methyl ethyl ketone, methyl isobutyl ketone, cyclohexanone, 2-heptanone, and 4-hydroxy-4-methyl-2-pentanone.

Examples of the aforementioned esters may include methyl acetate, ethyl acetate, propyl acetate, i-propyl acetate, butyl acetate, ethyl 2-hydroxypropionate, methyl 2-hydroxy-2-methylpropionate, ethyl 2-hydroxy-2-methylpropionate, methyl hydroxyacetate, ethyl hydroxyacetate, butyl hydroxyacetate, methyl lactate, ethyl lactate, propyl lactate, butyl lactate, methyl 3-hydroxypropionate, ethyl 3-hydroxypropionate, propyl 3-hydroxypropionate, butyl 3-hydroxypropionate, methyl 2-hydroxy-3-methylbutanoate, methyl methoxyacetate, ethyl methoxyacetate, propyl methoxyacetate, butyl methoxyacetate, methyl ethoxyacetate, ethyl ethoxyacetate, propyl ethoxyacetate, butyl ethoxyacetate, methyl propoxyacetate, ethyl propoxyacetate, propyl propoxyacetate, butyl propoxyacetate, methyl butoxyacetate, ethyl butoxyacetate, propyl butoxyacetate, butyl butoxyacetate, methyl 2-methoxypropionate, ethyl 2-methoxypropionate, propyl 2-methoxypropionate, butyl 2-methoxypropionate, methyl 2-ethoxypropionate, ethyl 2-ethoxypropionate, and the like.

[B] Solvents described above may be used singly or may be used as a mixture of two or more thereof.

The amount of the solvent to be used is, relative to 100 parts by mass of the components excluding the solvent of the radiation-sensitive composition, preferably from 200 parts by mass to 1,600 parts by mass, more preferably from 400 parts by mass to 1,000 parts by mass. By controlling the amount of the solvent used to the range described above, the coating properties of the radiation-sensitive composition to a glass substrate or the like can be improved, and further the occurrence of coating unevenness (streaky unevenness, pinmark unevenness, haze unevenness, etc.) can be suppressed, so that it is possible to obtain a coating film having an improved film thickness uniformity.

<[C] Acid Generator>

[C] Acid generator is a compound which generates an acid by irradiation with at least radiation. When the radiation-sensitive composition contains [C] acid generator, the acid-dissociable group can be eliminated from [A] compound.

Examples of [C] acid generator include oxime sulfonate compounds, onium salts, sulfone imide compounds, halogen-containing compounds, diazomethane compounds, sulfone compounds, sulfonic acid ester compounds, carboxylic acid ester compounds, and the like.

[C] Acid generator may be used singly or in combination of two or more thereof.

[Oxime Sulfonate Compound]

As the aforementioned oxime sulfonate compounds, compounds containing an oxime sulfonate group represented by the following formula (6) are preferable.

[Chem. 11]

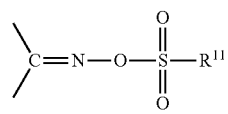

(6)

In the formula (6), $R^{11}$ is an alkyl group having 1 to 12 carbon atoms, a fluoroalkyl group having 1 to 12 carbon atoms, an alicyclic hydrocarbon group having 4 to 12 carbon atoms, an aryl group having 6 to 20 carbon atoms, or a group in which a part or all of the hydrogen atoms contained in the alkyl group, the alicyclic hydrocarbon group, and the aryl group are substituted with substituent(s).

The alkyl group represented by $R^{11}$ described above is preferably a linear or branched alkyl group having 1 to 12 carbon atoms. The linear or branched alkyl group having 1 to 12 carbon atoms may be substituted with a substituent and, as the substituent, for example, an alkoxy group having 1 to 10 carbon atoms, an alicyclic group including a bridged cyclic alicyclic group such as 7,7-dimethyl-2-oxonorbornyl group, and the like are mentioned. As the fluoroalkyl group having 1 to 12 carbon atoms, a trifluoromethyl group, a pentafluoroethyl group, a heptylfluoropropyl group, and the like are mentioned.

The alicyclic hydrocarbon group having 4 to 12 carbon atoms represented by $R^{11}$ described above may be substituted with a substituent and examples of the substituent include an alkyl group of 1 to 5 carbon atoms, an alkoxy group, and a halogen atom.

As the aryl group having 6 to 20 carbon atoms represented by $R^{11}$ described above, a phenyl group, a naphthyl group, a tolyl group, and a xylyl group are preferable. The aryl group mentioned above may be substituted with a substituent and examples of the substituent include an alkyl group of 1 to 5 carbon atoms, an alkoxy group, and a halogen atom.

As the compound containing an oxime sulfonate group represented by the formula (6), for example, oxime sulfonate compounds represented by the following formulae (6-1), (6-2), and (6-3) are mentioned.

[Chem. 12]

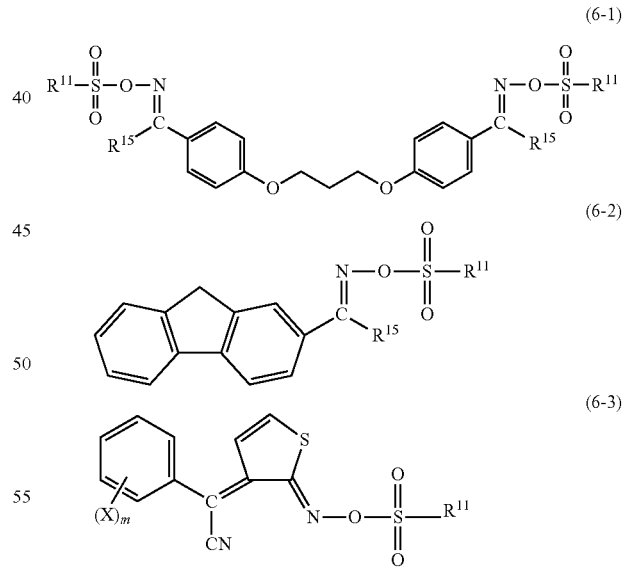

In the above formulae (6-1), (6-2), and (6-3), $R^{11}$ has the same meaning as in the aforementioned formula (6). In the above formulae (6-1), (6-2), and (6-3), $R^{15}$ is an alkyl group of 1 to 12 carbon atoms or a fluoroalkyl group of 1 to 12 carbon atoms.

In the formula (6-3), X is an alkyl group, an alkoxy group, or a halogen atom. m is an integer of 0 to 3. However, when X is plural, plural X may be the same or different.

The alkyl group represented by X in the formula (6-3) is preferably a linear or branched alkyl group having 1 to 4 carbon atoms. The alkoxy group represented by aforementioned X is preferably a linear or branched alkoxy group having 1 to 4 carbon atoms. The halogen atom represented by aforementioned X is preferably a chlorine atom or a fluorine atom. m is preferably 0 or 1. In the formula (6-3), a compound wherein m is 1, X is a methyl group, and the substitution position of X is ortho-position is particularly preferred.

As the oxime sulfonate compound represented by the above formula (6-3), for example, compounds represented by the following formulae (6-3-1) to (6-3-5) and the like are mentioned.

[Chem. 13]

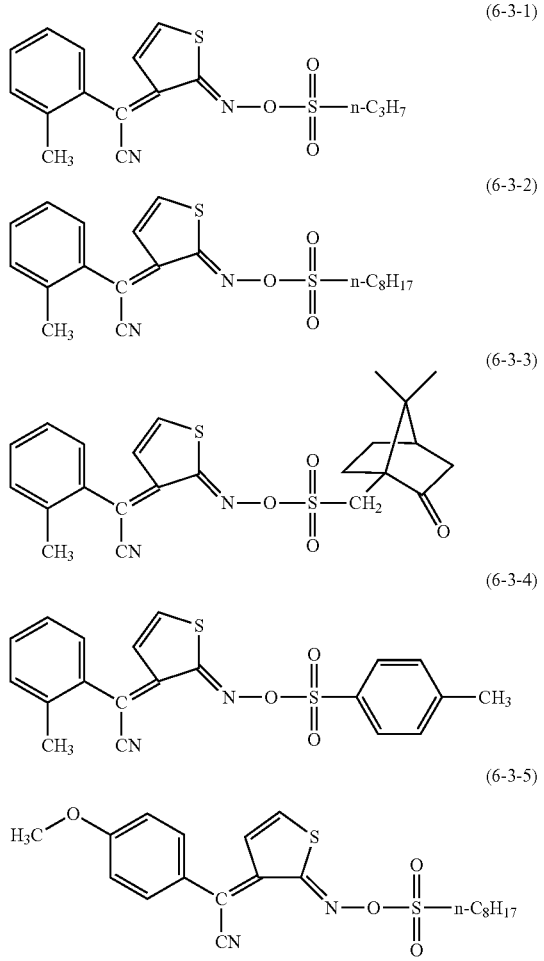

(6-3-1)

(6-3-2)

(6-3-3)

(6-3-4)

(6-3-5)

The compounds represented by the formulae (6-3-1) to (6-3-5) are (5-propylsulfonyloxyimino-5H-thiophen-2-ylidene)-(2-methylphenyl)acetonitrile, (5-octylsulfonyloxyimino-5H-thiophen-2-ylidene)-(2-methylphenyl)acetonitrile, (camphorsulfonyloxyimino-5H-thiophen-2-ylidene)-(2-methylphenyl)acetonitrile, (5-p-toluenesulfonyloxyimino-5H-thiophen-2-ylidene)-(2-methylphenyl)acetonitrile, (5-octyl sulfonyloxyimino)-(4-methoxyphenyl)acetonitrile, respectively and are available as commercially available products.

[Onium Salt]

Examples of preferred onium salts as [C] acid generator include diphenyliodonium salts, triphenylsulfonium salts, alkylsulfonium salts, benzylsulfonium salt, dibenzylsulfonium salts, substituted benzylsulfonium salts, benzothiazolium salts, and tetrahydrothiophenium salts.

Examples of the aforementioned diphenyliodonium salts include diphenyliodonium tetrafluoroborate, diphenyliodonium hexafluorophosphonate, diphenyliodonium hexafluoroarsenate, diphenyliodonium trifluoromethanesulfonate, diphenyliodonium trifluoroacetate, diphenyliodonium p-toluenesulfonate, diphenyliodonium butyl-tris(2,6-difluorophenyl)borate, 4-methoxyphenylphenyliodonium tetrafluoroborate, bis(4-t-butylphenyl)iodonium tetrafluoroborate, bis(4-t-butylphenyl)iodonium hexafluoroarsenate, bis(4-t-butylphenyl)iodonium trifluoromethanesulfonate, bis(4-t-butylphenyl)iodonium trifluoroacetate, bis(4-t-butylphenyl)iodonium p-toluenesulfonate, and bis(4-t-butylphenyl)iodonium camphorsulfonate.

Examples of the aforementioned triphenylsulfonium salts include triphenylsulfonium trifluoromethanesulfonate, triphenylsulfonium camphorsulfonate, triphenylsulfonium tetrafluoroborate, triphenylsulfonium trifluoroacetate, triphenylsulfonium p-toluenesulfonate, and triphenylsulfonium butyl-tris(2,6-difluorophenyl)borate.

Examples of the aforementioned alkylsulfonium salts include 4-acetoxyphenyldimethylsulfonium hexafluoroantimonate, 4-acetoxyphenyldimethyl sulfonium hexafluoroarsenate, dimethyl-4-(benzyloxycarbonyloxy)phenylsulfonium hexafluoroantimonate, dimethyl-4-(benzoyloxy)phenylsulfonium hexafluoroantimonate, dimethyl-4-(benzoyloxy) phenylsulfonium hexafluoroarsenate, and dimethyl-3-chloro-4-acetoxyphenylsulfonium hexafluoroantimonate.

Examples of the aforementioned benzylsulfonium salts include benzyl-4-hydroxyphenylmethylsulfonium hexafluoroantimonate, benzyl-4-hydroxyphenylmethylsulfonium hexafluorophosphate, 4-acetoxyphenylbenzylmethylsulfonium hexafluoroantimonate, benzyl-4-methoxyphenylmethylsulfonium hexafluoroantimonate, benzyl-2-methyl-4-hydroxyphenylmethylsulfonium hexafluoroantimonate, benzyl-3-chloro-4-hydroxyphenylmethylsulfonium hexafluoroarsenate, and 4-methoxybenzyl-4-hydroxyphenylmethylsulfonium hexafluorophosphate.

Examples of the aforementioned dibenzylsulfonium salts include dibenzyl-4-hydroxyphenylsulfonium hexafluoroantimonate, dibenzyl-4-hydroxyphenylsulfonium hexafluorophosphate, 4-acetoxyphenyldibenzylsulfonium hexafluoroantimonate, dibenzyl-4-methoxyphenylsulfonium hexafluoroantimonate, dibenzyl-3-chloro-4-hydroxyphenylsulfonium hexafluoroarsenate, dibenzyl-3-methyl-4-hydroxy-5-t-butylphenylsulfonium hexafluoroantimonate, and benzyl-4-methoxybenzyl-4-hydroxyphenylsulfonium hexafluorophosphate.

Examples of the aforementioned substituted benzylsulfonium salts include p-chlorobenzyl-4-hydroxyphenylmethylsulfonium hexafluoroantimonate, p-nitrobenzyl-4-hydroxyphenylmethylsulfonium hexafluoroantimonate, p-chlorobenzyl-4-hydroxyphenylmethylsulfonium hexafluorophosphate, p-nitrobenzyl 3-methyl-4-hydroxyphenylmethylsulfonium hexafluoroantimonate, 3,5-dichloro-benzyl-4-hydroxyphenylmethylsulfonium hexafluoroantimonate, and o-chlorobenzyl-3-chloro-4-hydroxyphenylmethylsulfonium hexafluoroantimonate.

Examples of the aforementioned benzothiazolium salts include 3-benzylbenzothiazolium hexafluoroantimonate, 3-benzylbenzothiazolium hexafluorophosphate, 3-benzylbenzothiazolium tetrafluoroborate, 3-(p-methoxybenzyl)benzothiazolium hexafluoroantimonate, 3-benzyl-2-methylthiobenzothiazolium hexafluoroantimonate, and 3-benzyl-5-chlorobenzothiazolium hexafluoroantimonate.

Examples of the aforementioned tetrahydrothiophenium salts include 4,7-di-n-butoxy-1-naphthyltetrahydrothiophenium trifluoromethanesulfonate, 1-(4-n-butoxynaphthalen-1-yl)tetrahydrothiophenium trifluoromethanesulfonate, 1-(4-n-butoxynaphthalen-1-yl)tetrahydrothiophenium nonafluoro-n-butanesulfonate, 1-(4-n-butoxynaphthalen-1-yl)tetrahydrothiophenium-1,1,2,2-tetrafluoro-2-(norbornan-2-yl) ethanesulfonate, 1-(4-n-butoxynaphthalen-1-yl)tetrahydrothiophenium-2-(5-t-butoxy carbonyloxybicyclo[2.2.1]heptan-2-yl)-1,1,2,2-tetrafluoroethanesulfonate, and 1-(4-n-butoxynaphthalen-1-yl)tetrahydrothiophenium-2-(6-t-butoxycarbonyloxybicyclo[2.2.1]heptan-2-yl)-1,1,2,2-tetrafluoroethanesulfonate.

[Sulfone Imide Compound]

Examples of preferred sulfone imide compounds as [C] acid generator include N-(trifluoromethylsulfonyloxy)succinimide, N-(camphorsulfonyloxy)succinimide, N-(4-methylphenylsulfonyloxy)succinimide, N-(2-trifluoromethylphenylsulfonyloxy)succinimide, N-(4-fluorophenylsulfonyloxy)succinimide, N-(trifluoromethylsulfonyloxy)phthalimide, N-(camphorsulfonyloxy)phthalimide, N-(2-trifluoromethylphenylsulfonyloxy)phthalimide, N-(2-fluorophenylsulfonyloxy)phthalimide, N-(trifluoromethylsulfonyloxy)diphenylmaleimide, N-(camphorsulfonyloxy)diphenylmaleimide, 4-methylphenylsulfonyloxy)diphenylmaleimide, N-(2-trifluoromethylphenylsulfonyloxy)diphenylmaleimide, N-(4-fluorophenylsulfonyloxy)diphenyl maleimide, N-(4-fluorophenylsulfonyloxy)diphenylmaleimide, N-(phenylsulfonyloxy)bicyclo[2.2.1]hept-5-ene-2,3-dicarboximide, N-(4-methylphenylsulfonyloxy)bicyclo[2.2.1]hept-5-ene-2,3-dicarboximide, N-(trifluoromethanesulfonyloxy)bicyclo[2.2.1]hept-5-ene-2,3-dicarboximide, N-(nonafluorobutanesulfonyloxy)bicyclo[2.2.1]hept-5-ene-2,3-dicarboximide, N-(camphorsulfonyloxy)bicyclo[2.2.1]hept-5-ene-2,3-dicarboximide, N-(camphorsulfonyloxy)-7-oxabicyclo[2.2.1]hept-5-ene-2,3-dicarboximide, N-(trifluoromethylsulfonyloxy)-7-oxabicyclo[2.2.1]hept-5-ene-2,3-dicarboximide, N-(4-methylphenylsulfonyloxy)bicyclo[2.2.1]hept-5-ene-2,3-dicarboximide, N-(4-methyl-phenylsulfonyloxy)-7-oxabicyclo[2.2.1]hept-5-ene-2,3-dicarboximide, N-(2-trifluoromethylphenylsulfonyloxy)bicyclo[2.2.1]hept-5-ene-2,3-dicarboximide, N-(2-trifluoromethylphenylsulfonyloxy)-7-oxabicyclo[2.2.1]hept-5-ene-2,3-dicarboximide, N-(4-fluorophenylsulfonyloxy)bicyclo[2.2.1]hept-5-ene-2,3-dicarboximide, N-(4-fluorophenylsulfonyloxy)-7-oxabicyclo[2.2.1]hept-5-ene-2,3-dicarboximide, N-(trifluoromethylsulfonyloxy)bicyclo[2.2.1]heptan-5,6-oxy-2,3-carboximide, N-(camphorsulfonyloxy)bicyclo[2.2.1]heptan-5,6-oxy-2,3-dicarboximide, N-(4-methylphenylsulfonyloxy)bicyclo[2.2.1]heptan-5,6-oxy-2,3-dicarboximide, N-(2-trifluoromethylphenylsulfonyloxy)bicyclo[2.2.1]heptan-5,6-oxy-2,3-dicarboximide, N-(4-fluorophenylsulfonyloxy)bicyclo[2.2.1]heptan-5,6-oxy-2,3-dicarboximide, N-(trifluoromethylsulfonyloxy)naphthyldicarboximide, N-(camphorsulfonyloxy)naphthyldicarboximide, N-(4-methylphenylsulfonyloxy)naphthyldicarboximide, N-(phenylsulfonyloxy)naphthyldicarboximide, N-(2-trifluoromethylphenylsulfonyloxy)naphthyldicarboximide, N-(4-fluorophenylsulfonyloxy)naphthyldicarboximide, N-(pentafluoroethylsulfonyloxy)naphthyldicarboximide, N-(heptafluoropropylsulfonyloxy)naphthyldicarboximide, N-(nonafluorobutylsulfonyloxy)naphthyldicarboximide, N-(ethylsulfonyloxy)naphthyldicarboximide, N-(propylsulfonyloxy)naphthyldicarboximide, N-(butylsulfonyloxy)naphthyldicarboximide, N-(pentylsulfonyloxy)naphthyldicarboximide, N-(hexylsulfonyloxy)naphthyldicarboximide, N-(heptylsulfonyloxy)naphthyldicarboximide, N-(octylsulfonyloxy)naphthyldicarboximide, N-(nonylsulfonyloxy)naphthyldicarboximide, and the like.

[Halogen-Containing Compound]

Examples of preferred halogen-containing compounds as [C] acid generator include haloalkyl group-containing hydrocarbon compounds and haloalkyl group-containing heterocyclic compounds.

[Diazomethane Compound]

Examples of preferred diazomethane compounds as [C] acid generator include bis(trifluoromethylsulfonyl)diazomethane, bis(cyclohexylsulfonyl)diazomethane, bis(phenylsulfonyl)diazomethane, bis(p-tolylsulfonyl)diazomethane, bis(2,4-xylylsulfonyl)diazomethane, bis(p-chlorophenylsulfonyl)diazomethane, methylsulfonyl-p-toluenesulfonyldiazomethane, cyclohexylsulfonyl(1,1-dimethylethyl)diazomethane, his (1,1-dimethylethylsulfonyl)diazomethane, phenylsulfonyl (benzoyl)diazomethane, and the like.

[Sulfone Compound]

Examples of preferred sulfone compounds as [C] acid generator include β-keto sulfone compounds, β-sulfonyl sulfone compounds, and diaryl disulfone compounds.

[Sulfonic Acid Ester Compound]

Examples of preferred sulfonic acid ester compounds as [C] acid generator include alkylsulfonic acid esters, haloalkylsulfonic acid esters, aryl sulfonic acid esters, and iminosulfonates.

[Carboxylic Acid Ester Compound]

Examples of preferred carboxylic acid ester compounds as [C] acid generator include carboxylic acid o-nitrobenzyl esters.

As [C] acid generator, oxime sulfonate compounds, onium salts, and sulfonic acid ester compounds are preferable, and oxime sulfonate compounds are more preferable. As the aforementioned oxime sulfonate compounds, compounds containing oxime sulfonate groups represented by the formulae (6-3-1) to (6-3-5) are preferable, and compounds represented by the formula (6-3-5) are more preferable.

Moreover, as the aforementioned onium salts, tetrahydrothiophenium salts and benzylsulfonium salts are preferable, 4,7-di-n-butoxy-1-naphthyltetrahydrothiophenium trifluoromethanesulfonate, and benzyl-4-hydroxyphenylmethylsulfonium hexafluorophosphate are more preferable, and 4,7-di-n-butoxy-1-naphthyltetrahydrothiophenium trifluoromethanesulfonate is further preferable. As the aforementioned sulfonic acid ester compounds, haloalkylsulfonic acid esters are preferable, N-hydroxynaphthalimide-trifluoromethanesulfonic acid ester is more preferable. When the aforementioned compounds are used as [C] acid generator, the radiation-sensitive composition of the present embodiment can have improve sensitivity and can exhibit further improved solubility.

The content of [C] acid generator is preferably from 0.1 parts by mass to 10 parts by mass, more preferably from 1 part by mass to 5 parts by mass relative to 100 parts by mass of [A] compound. When the content of [C] acid generator is controlled to the aforementioned range, it is possible to optimize the sensitivity of the radiation-sensitive composition, so that a concave pattern having a high resolution can be formed through the aforementioned steps (i) to (vi).

<[D] Sensitizer>

The radiation-sensitive composition of the embodiment of the invention can contain [D] sensitizer.

When the composition of the embodiments of the invention further contains [D] sensitizer, it is possible to further improve the radiation sensitivity of the composition. [D] Sensitizer is preferably a compound which absorbs active rays or radiation to come into an electronically excited state. When [D] Sensitizer which comes into the electronically excited state comes into contact with [C] acid generator, electron transfer, energy transfer, heat generation, and the like occur and thereby [C] acid generator undergoes a chemical change and is decomposed to generate an acid.

As [D] sensitizer, there are mentioned compounds which belong to the following compounds and have an absorption wavelength in the region of 350 nm to 450 nm.

Examples of [D] sensitizer include polynuclear aromatic compounds such as pyrene, perylene, triphenylene, anthracene, 9,10-dibutoxyanthracene, 9,10-diethoxyanthracene, 3,7-dimethoxyanthracene, and 9,10-dipropyloxyanthracene;

xanthenes such as fluorescein, eosin, erythrosine, Rhodamine B, and Rose Bengal;

xanthones such as xanthone, thioxanthone, dimethylthioxanthone, diethylthioxanthone, and isopropylthioxanthone;

cyanines such as thiacarbocyanine and oxacarbocyanine;

merocyanines such as merocyanine and carboxymethylmerocyanine;

rhodacyanines;

oxonols;

thiazines such as thionine, methylene blue, and toluidine blue;

acridines such as acridine orange, chloroflavin, and acriflavin;

acridones such as acridone and 10-butyl-2-chloroacridone;

anthraquinones such as anthraquinone;

squaryliums such as squarylium;

styryls;

base styryls such as 2-[2-[4-(dimethylamino)phenyl]ethenyl]benzoxazole; and coumarins such as 7-diethylamino-4-methylcoumarin, 7-hydroxy-4-methylcoumarin, and 2,3,6,7-tetrahydro-9-methyl-1H,5H,11H[1]benzopyrano[6,7,8-ij]quinolizine-11-none, and the like.

Among these [D] sensitizers, polynuclear aromatic compounds, acridones, styryls, base styryls, coumarins, and xanthones are preferable, and xanthones are more preferable. Particularly preferred are diethylthioxanthone and isopropylthioxanthone among xanthones.

[D] sensitizers may be used singly or may be used as a mixture of two or more thereof. The content of [D] sensitizer is preferably from 0.1 parts by mass to 8 parts by mass, more preferably from 1 part by mass to 4 parts by mass relative to 100 parts by mass of [A] compound. When the content of [D] sensitizer is controlled to the aforementioned range, it is possible to optimize the sensitivity of the radiation-sensitive composition, so that a concave pattern having a high resolution can be formed through the steps (i) to (iii).

<[E] Quencher>

The composition of the embodiment of the invention can contain [E] quencher, in addition to [A] compound having an acid-dissociable group, [C] acid generator, and [D] sensitizer.

[E] quencher functions as an acid diffusion suppressing material which prevents the diffusion of the acid from [C] acid generator. As [E] quencher, it is possible to use a photodegradable base that generates a weak acid upon exposure to light. The photodegradable base generates an acid at an exposed portion, while a high acid trapping function by the anion is exhibited at an unexposed portion to trap the acid from [C] acid generator, so that the acid diffusing from the exposed portion to the unexposed portion is deactivate. That is, since the acid is deactivate only at the unexposed portion, contrast of the elimination reaction of the protecting group is improved and, as a result, it is possible to further improve the resolution. An example of the photodegradable base is an onium salt compound that is decomposed upon exposure to lose the acid-diffusion controllability.

[E] quencher may be used singly, or may be used in a mixture of two or more thereof.

The content of [E] quencher is preferably from 0.001 parts by mass to 5 parts by mass, more preferably from 0.005 parts by mass to 3 parts by mass relative to 100 parts by mass of [A] compound. When the content of [E] quencher is controlled to the aforementioned range, it is possible to optimize the sensitivity of the radiation-sensitive composition, so that a concave pattern having a high resolution can be formed through the steps (i) to (iii).

<[F] Polymerizable Compound>

The radiation-sensitive composition can be cured when the composition contains [F] polymerizable compound.

[F] polymerizable compound is a polymerizable compound having an ethylenically unsaturated bond. However, it is a compound other than [A] compound.

As such [F] polymerizable compound, from the viewpoint that polymerizability is good and strength of the film obtained from the radiation-sensitive composition is improved, monofunctional, difunctional, or trifunctional or higher functional (meth)acrylic acid esters are preferable.

Incidentally, the monofunctional compound means a compound having one (meth)acryloyl group and a bifunctional or trifunctional or higher functional compound means a compound having two or three or more (meth)acryloyl groups, respectively.

Examples of the aforementioned monofunctional (meth) acrylic acid esters include 2-hydroxyethyl acrylate, 2-hydroxyethyl methacrylate, diethylene glycol monoethyl ether acrylate, diethylene glycol monoethyl ether methacrylate, (2-acryloyloxyethyl) (2-hydroxypropyl) phthalate, (2-methacryloyloxyethyl) (2-hydroxypropyl) phthalate, and ω-carboxypolycaprolactone monoacrylate. Examples of commercially available products include Aronix (registered trademark) M-101, Aronix M-111, Aronix M-114, and Aronix M-5300 (all from Toagosei Co., Ltd.); KAYARAD (registered trademark) TC-110S, and KAYARAD TC-120S (all from Nippon Kayaku Co., Ltd.); Viscoat 158, and Viscoat 2311 (all from Osaka Organic Chemical Industry Ltd.).

Examples of the aforementioned bifunctional (meth) acrylic acid esters include ethylene glycol diacrylate, propylene glycol diacrylate, propylene glycol dimethacrylate, ethylene glycol dimethacrylate, diethylene glycol diacrylate, diethylene glycol dimethacrylate, tetraethylene glycol diacrylate, tetraethylene glycol dimethacrylate, 1,6-hexanediol diacrylate, 1,6-hexanediol dimethacrylate, 1,9-nonanediol diacrylate, and 1,9-nonanediol dimethacrylate. Examples of commercially available products include Aronix (registered trademark) M-210, Aronix M-240, and Aronix M-6200 (all from Toagosei Co., Ltd.); KAYARAD (registered trademark) HDDA, KAYARAD HX-220, and KAYARAD R-604 (all from Nippon Kayaku Co., Ltd.); Viscoat 260, Viscoat 312, and Viscoat 335HP (all from Osaka Organic Chemical Industry Ltd.); Light Acrylate 1,9-NDA (Kyoeisha Chemical Co., Ltd.).

Examples of the aforementioned trifunctional or higher functional (meth)acrylic acid esters include trimethylolpropane triacrylate, trimethylolpropane trimethacrylate, pentaerythritol triacrylate, pentaerythritol trimethacrylate, pentaerythritol tetraacrylate, pentaerythritol tetramethacrylate, dipentaerythritol pentaacrylate, dipentaerythritol pentamethacrylate, dipentaerythritol hexaacrylate, a mixture of dipentaerythritol pentaacrylate and dipentaerythritol hexaacrylate, dipentaerythritol hexamethacrylate, ethylene oxide-modified dipentaerythritol hexaacrylate, tri(2-acryloyloxyethyl)phosphate, tri(2-methacryloyloxyethyl)phosphate, succinic acid-modified pentaerythritol triacrylate, succinic acid-modified dipentaerythritol pentaacrylate, and tris(acryloxyethyl) isocyanurate, and also polyfunctional urethane acrylate-based compounds obtained by reacting a compound having a linear alkylene group and an alicyclic structure and having two or more isocyanate groups with a compound having one or more hydroxyl groups in a molecule and having three, four, or five (meth)acryloyloxy groups. Examples of commercially available products include Aronix (registered trademark) M-309, Aronix M-315, Aronix M-400, Aronix M-405, Aronix M-450, Aronix M-7100, Aronix M-8030, Aronix M-8060, and Aronix TO-1450 (all from Toagosei Co., Ltd.); KAYARAD (registered trademark) TMPTA, KAYARAD DPHA, KAYARAD DPCA-20, KAYARAD DPCA-30, KAYARAD DPCA-60, KAYARAD DPCA-120, and KAYARAD DPEA-12 (all from Nippon Kayaku Co., Ltd.); Viscoat 295, Viscoat 300, Viscoat 360, Viscoat GPT, Viscoat 3PA, and Viscoat 400 (all from Osaka Organic Chemical Industry Ltd.); as commercial products containing the polyfunctional urethane acrylate-based compound, New Frontier (registered trademark) R-1150 (Dai-ichi Kogyo Seiyaku Co., Ltd.), KAYARAD (registered trademark) DPHA-40H (Nippon Kayaku Co., Ltd.).

Among these [F] polymerizable compounds, ω-carboxy-polycaprolactone monoacrylate, 1,9-nonanediol dimethacrylate, trimethylolpropane triacrylate, pentaerythritol triacrylate, pentaerythritol tetraacrylate, dipentaerythritol pentaacrylate, dipentaerythritol hexaacrylate, a mixture of dipentaerythritol hexaacrylate and dipentaerythritol pentaacrylate, ethylene oxide-modified dipentaerythritol hexaacrylate, succinic acid-modified pentaerythritol triacrylate, succinic acid-modified dipentaerythritol pentaacrylate, commercially available products containing polyfunctional urethane acrylate-based compounds are preferred. Of these, trifunctional or higher functional (meth)acrylic acid esters are preferable, and a mixture of dipentaerythritol hexaacrylate and dipentaerythritol pentaacrylate is particularly preferable.

[F] Polymerizable compounds may be used singly or may be used as a mixture of two or more thereof. The amount of [F] polymerizable compound to be used is preferably from 1 part by mass to 300 parts by mass, more preferably from 3 parts by mass to 200 parts by mass, and further preferably from 5 parts by mass to 100 parts by mass relative to 100 parts by mass of [A] compound. When the amount of [F] polymerizable compound is controlled to the aforementioned range, it is possible to enhance hardness of the coating film obtained from the radiation-sensitive resin composition, and heat resistance can be made better.

<[G] Radiation-Sensitive Polymerization Initiator>

[G] Radiation-sensitive polymerization initiator is a compound that promotes the polymerization of [F] polymerizable compound upon irradiation with radiation. Therefore, in the case where the radiation-sensitive composition contains [F] polymerizable compound, it is preferable to use [G] radiation-sensitive polymerization initiator.

As [G] radiation-sensitive polymerization initiator, O-acyloxime compounds, acetophenone compounds, and biimidazole compounds may be mentioned.

Specific examples of the aforementioned O-acyloxime compounds include ethanone-1-[9-ethyl-6-(2-methylbenzoyl)-9H-carbazol-3-yl]-1-(O-acetyloxime), 1-[9-ethyl-6-benzoyl-9.H.-carbazol-3-yl]-octane-1-one oxime-O-acetate, 1-[9-ethyl-6-(2-methylbenzoyl)-9.H.-carbazol-3-yl]-ethane-1-one oxime-O-benzoate, 1-[9-n-butyl-6-(2-ethyl-benzoyl)-9.H.-carbazol-3-yl]-ethan-1-one oxime-O-benzoate, ethanone-1-[9-ethyl-6-(2-methyl-4-tetrahydrofuranylbenzoyl)-9.H.-carbazol-3-yl]-1-(O-acetyloxime), ethanone-1-[9-ethyl-6-(2-methyl-4-tetrahydropyranylbenzoyl)-9.H.-carbazol-3-yl]-1-(O-acetyloxime), ethanone-1-[9-ethyl-6-(2-methyl-5-tetrahydrofuranylbenzoyl)-9.H.-carbazol-3-yl]-1-(O-acetyloxime), ethanone-1-[9-ethyl-6-{2-methyl-4-(2,2-dimethyl-1,3-dioxolanyl) methoxybenzoyl}-9.H.-carbazol-3-yl]-1-(O-acetyloxime), and ethanone-1-[9-ethyl-6-(2-methyl-4-tetrahydrofuranylmethoxybenzoyl)-9.H.-carbazol-3-yl]-1-(O-acetyloxime). These O-acyloxime compounds may be used singly or as a mixture of two or more thereof.

Of these, as preferable O-acyloxime compounds, there may be mentioned ethanone-1-[9-ethyl-6-(2-methylbenzoyl)-9H-carbazol-3-yl]-1-(O-acetyloxime), ethanone-1-[9-ethyl-6-(2-methyl-4-tetrahydrofuranylmethoxybenzoyl)-9.H.-carbazol-3-yl]-1-(O-acetyloxime), and ethanone-1-[9-ethyl-6-{2-methyl-4-(2,2-dimethyl-1,3-dioxolanyl) methoxybenzoyl}-9.H.-carbazol-3-yl]-1-(O-acetyloxime).

As the aforementioned acetophenone compounds, α-amino ketone compounds and α-hydroxy ketone compounds may be mentioned.

Specific examples of the aforementioned α-amino ketone compounds include 2-benzyl-2-dimethylamino-1-(4-morpholinophenyl)-butan-1-one, 2-dimethylamino-2-(4-methylbenzyl)-1-(4-morpholin-4-yl-phenyl)-butan-1-one, and 2-methyl-1-(4-methylthiophenyl)-2-morpholinopropan-1-one.

Specific examples of the aforementioned α-hydroxy ketone compounds include 1-phenyl-2-hydroxy-2-methyl-propan-1-one, 1-(4-i-propylphenyl)-2-hydroxy-2-methyl-propan-1-on, 4-(2-hydroxyethoxy)phenyl-(2-hydroxy-2-propyl) ketone, and 1-hydroxycyclohexyl phenyl ketone.

The above acetophenone compounds may be used singly or as a mixture of two or more thereof.

Among these acetophenone compounds, the α-amino ketone compounds are preferred, and 2-dimethylamino-2-(4-methylbenzyl)-1-(4-morpholin-4-yl-phenyl)-butan-1-one, and 2-methyl-1-(4-methylthiophenyl)-2-morpholino-propan-1-one are particularly preferred.

Specific examples of the aforementioned biimidazole compounds include 2,2'-bis(2-chlorophenyl)-4,4',5,5'-tetrakis(4-ethoxycarbonyl phenyl)-1,2'-biimidazole, 2,2'-bis(2-chlorophenyl)-4,4',5,5'-tetraphenyl-1,2'-biimidazole, 2,2'-bis(2,4-dichlorophenyl)-4,4',5,5'-tetraphenyl-1,2'-biimidazole, and 2,2'-bis(2,4,6-trichlorophenyl)-4,4',5,5'-tetraphenyl-1,2'-biimidazole. These biimidazole compounds may be used singly or as a mixture of two or more thereof.

Among these biimidazole compounds, 2,2'-bis(2-chlorophenyl)-4,4',5,5'-tetraphenyl-1,2'-biimidazole, 2,2'-bis(2,4-dichlorophenyl)-4,4',5,5'-tetraphenyl-1,2'-biimidazole, and 2,2'-bis(2,4,6-trichlorophenyl)-4,4',5,5'-tetraphenyl-1,2'-biimidazole are preferable, and 2,2'-bis(2,4-dichlorophenyl)-4,4',5,5'-tetraphenyl-1,2'-biimidazole is particularly preferable.

In the radiation-sensitive composition, in the case where the bi-imidazole compound is used as [G] radiation-sensitive polymerization initiator, in order to sensitize it, an aliphatic or aromatic compound having a dialkylamino group (hereinafter referred to as "amino-based sensitizer") can be added.

Examples of such an amino-based sensitizer include 4,4'-bis(dimethylamino)benzophenone and 4,4'-bis(diethylamino)benzophenone. Of these amino-based sensitizers, 4,4'-bis(diethylamino)benzophenone is particularly preferable. These amino-based sensitizers can be used singly or as a mixture of two or more thereof.

Furthermore, in the case where the biimidazole compound and the amino-based sensitizer are used in combination, a thiol compound can be added as a hydrogen radical donor. The biimidazole compound is sensitized by the amino-based sensitizer and cleaved to generate an imidazole radical, but there is a case where a high polymerization initiation ability is not exhibited without further treatment. However, by adding a thiol compound to the system in which the biimidazole compound and the amino-based sensitizer coexist, a hydrogen radical is donated from the thiol compound to the imidazole radical. As a result, the imidazole radical is converted into a neutral imidazole and also a component having a sulfur radical whose polymerization initiation ability is high is generated. Therefore, in the case where the biimidazole compound, the amino-based sensitizer, and the thiol compound are added to the radiation-sensitive composition, it is possible to form a film having high hardness even at a low irradiation dose.

Specific examples of such thiol compounds include aromatic thiol compounds such as 2-mercaptobenzothiazole, 2-mercaptobenzoxazole, 2-mercaptobenzimidazole, and 2-mercapto-5-methoxy-benzothiazole;

aliphatic mono thiol compounds such as 3-mercaptopropionic acid and methyl 3-mercaptopropionate; and bifunctional or higher functional aliphatic thiol compounds such as pentaerythritol tetra(mercaptoacetate) and pentaerythritol tetra(3-mercaptopropionate).

These thiol compounds may be used singly or as a mixture of two or more thereof.

Among these thiol compounds, 2-mercaptobenzothiazole is particularly preferable.

In the case where the biimidazole compound and the amino-based sensitizer are used in combination, the amount of the amino-based sensitizer to be used is preferably from 0.1 parts by mass to 50 parts by mass, and more preferably from 1 part by mass to 20 parts by mass relative to 100 parts by mass of the biimidazole compound. When the amount of the amino-based sensitizer is controlled to the aforementioned range, it is possible to improve the reactivity at the time of exposure.

Also, in the case where the biimidazole compound, the amino-based sensitizer, and the thiol compound are used in combination, the amount of the thiol compound to be used is preferably from 0.1 parts by mass to 50 parts by mass, and more preferably from 1 part by mass to 20 parts by mass relative to 100 parts by mass of the biimidazole compound. When the amount of the thiol compound is controlled to the aforementioned range, it is possible to improve the reactivity at the time of exposure.

In the case where the radiation-sensitive composition contains [G] radiation-sensitive polymerization initiator, it is preferable to contain at least one selected from the group consisting of O-acyloxime compounds and acetophenone compounds, and the composition may further contain the biimidazole compound.

[G] Radiation-sensitive polymerization initiator may be used singly or may be used as a mixture of two or more thereof.

The amount of [G] radiation-sensitive polymerization initiator to be used is preferably from 0.05 parts by mass to 30 parts by mass, and more preferably from 0.1 part by mass to 15 parts by mass relative to 100 parts by mass of [A] compound. When the amount of [G] radiation-sensitive polymerization initiator is controlled to the aforementioned range, it is possible to perform the curing of the coating film with high radiation sensitivity even at a low irradiation dose.

<Other Optional Components>

The radiation-sensitive composition may further contain other optional components as long as it does not impair the effects of the invention.

As the other optional components, surfactants, storage stabilizers, adhesion promoters, heat-resistance improving agent, and the like may be mentioned.

The other optional components may be used singly or may be used as a mixture of two or more thereof.

Next, a film-forming material suitable for forming a high-definition pattern using the substrate having a concave pattern of the embodiment of the invention will be described.

[Film-Forming Material]

The film-forming material is not particularly limited. For example, it may be a material capable of forming a wiring and is preferably a liquid ink or paste having fluidity.

Examples of the film-forming material include conductive film-forming inks, conductive film-forming pastes, resin solution inks capable of forming a film, resin solution pastes, coloring inks containing a pigment or a dye, coloring pastes, organic semiconductor solutions or oxide semiconductor dispersions, organic EL light-emitting material solutions or quantum dots, nanocarbon conductive film-forming inks, carbon nanotubes, functional inks of nanocarbon such as graphene or carbon black, conductive film-forming pastes, and the like.

Of these, the conductive film-forming inks and the conductive film-forming pastes are preferable, and specifically, an ink or paste in which metal particles are dispersed, an ink or paste containing a metal salt and a reducing agent, an ink or paste in which metal oxide particles capable of being metallized by heating under a reducing atmosphere are dispersed, a dispersion or solution of a conductive polymer, and an ink or paste in which nanocarbon such as carbon nanotube or graphene is dispersed are preferable, and particularly, from the viewpoint of conductivity and coating properties, the ink or paste in which metal particles are dispersed and the ink or paste containing a metal salt and a reducing agent are preferable.

These inks or pastes can form coating films by various printing methods or coating methods, and any of the coating films becomes an electrically conductive film (wiring) through heating.

As such inks or pastes, materials having a viscosity (temperature: 20° C., shear rate: 10 sec$^{-1}$) of preferably 0.001 Pa·s to 100 Pa·s, more preferably 0.001 Pa·s to 1 Pa·s are desirable.

Incidentally, in the aforementioned step (iv), in the case where the film-forming material is applied by a method such as offset printing or screen printing, a material of a high viscosity region is suitable and the viscosity of the material at this time is preferably from 1 Pa·s to 50 Pa·s. Particularly, in the case of offset printing, the viscosity is preferably from 10 Pa·s to 50 Pa·s.

(Metal Salt)

The metal salt is converted into a simple substance of metal through reduction of the metal ion contained in the metal salt with the reducing agent. Then, the substance plays a role of expressing the conductivity in the wiring to be formed. For example, in the case where the metal salt is a copper salt, the copper ion contained in the copper salt is reduced with the reducing agent and becomes a simple substance of copper, thereby forming a conductive wiring.

A copper salt or a silver salt is preferable as the metal salt.

The metal salts may be used singly or may be used as a mixture of two or more thereof.

The copper salt may be a compound containing a copper ion, and is not particularly limited but, for example, copper salts composed of a copper ion and at least one of an inorganic anion species and an organic anionic species are mentioned. Of these, from the viewpoint of solubility, it is preferable to use one or two or more selected from the group consisting of copper carboxylates, copper hydroxides, and complex salts of copper and an acetylacetone derivative.

Examples of the above-mentioned copper carboxylates include copper salts of dicarboxylic acids such as copper malonate, copper succinate, and copper maleate, copper salts of aromatic carboxylic acids such as copper benzoate, copper salicylate, copper salts of organic acids having a monocarboxy group, such as copper acetate, copper trifluoroacetate, copper propionate, copper butyrate, copper isobutyrate, copper 2-methylbutyrate, copper 2-ethylbutyrate, copper valerate, copper isovalerate, copper pivalate, copper hexanoate, copper heptanoate, copper octanoate, copper 2-ethylhexanoate, copper nonanoate, copper formate, copper hydroxyacetate, copper glyoxylate, copper lactate, copper oxalate, copper tartrate, copper malate, and copper citrate as preferred compounds. Incidentally, copper formate may be an anhydride or may be hydrated. As the hydrate of copper formate, a tetrahydrate may be mentioned.

Moreover, examples of the aforementioned complex salts of copper and an acetylacetone derivative include acetylacetonato copper, 1,1,1-trimethyl acetylacetonato copper, 1,1,1,5,5,5-hexamethylacetylacetonato copper, 1,1,1-trifluoroacetylacetonato copper, and 1,1,1,5,5,5-hexafluoroacetylacetonato copper as preferred compounds.

Of these, when solubility and dispersibility to the reducing agent or the solvent and electric resistance properties of the wiring to be formed are considered, copper carboxylates such as copper acetate, copper propionate, copper isobutyrate, copper valerate, copper isovalerate, copper formate, copper formate tetrahydrate, and copper glyoxylate are preferable.

The silver salt is not particularly limited as long as it is a silver salt.

Examples thereof include silver nitrate, silver acetate, silver oxide, acetylacetone silver, silver benzoate, silver bromide, silver bromate, silver carbonate, silver chloride, silver citrate, silver fluoride, silver iodate, silver iodide, silver lactate, silver nitrite, silver perchlorate, silver phosphate, silver sulfate, silver sulfide, and silver trifluoroacetate.

As the metal salt, from the viewpoint of suppressing the migration of metal atoms in the wiring to be formed, the use of a copper salt is preferable. Among the copper salts, copper formate that is particularly excellent in reducibility is preferable. Copper formate may be an anhydride or may be copper formate tetrahydrate.

The content of the metal salt in the film-forming material is preferably in the range of 0.01% by mass to 50% by mass, and more preferably in the range of 0.1% by mass to 30% by mass based on the total amount of the film-forming material. When the content of the metal salt is controlled to the above-described range, it is possible to form a wiring having a stable and excellent conductivity. From the viewpoint of obtaining a wiring of a low resistance value, the content of the metal salt is preferably 0.01% by mass or more. In view of obtaining a chemically stable film-forming material, the content of the metal salt is preferably 50% by mass or less.

(Reducing Agent)

For the purpose of reducing the metal ion contained in the metal salt to form a metal simple substance, the film-forming material preferably contains a reducing agent together with the aforementioned metal salt. The reducing agent is not particularly limited as long as it has reducing ability to the metal ion contained in the metal salt to be used.

Examples of the reducing agent include monomolecular compounds having one or two or more functional groups selected from the group consisting of a thiol group, a nitrile group, an amino group, a hydroxy group, and a hydroxycarbonyl group and polymers having one or two or more heteroatoms selected from the group consisting of a nitrogen atom, an oxygen atom, and a sulfur atoms in the molecular structure.

Examples of the monomolecular compounds include alkanethiols, amines, hydrazines, monoalcohols, diols, hydroxyamines, α-hydroxy ketones, and carboxylic acids.

Examples of the polymers include polyvinylpyrrolidone, polyethyleneimine, polyaniline, polypyrrole, polythiophene, polyacrylamides, polyacrylic acid, carboxymethyl cellulose, polyvinyl alcohol, and polyethylene oxide.

Of these, in consideration of solubility of the metal salt, one or more selected from the group consisting of alkanethiols and amines are preferable.

Examples of the aforementioned alkanethiols include ethanethiol, n-propanethiol, i-propanethiol, n-butanethiol, i-butanethiol, t-butanethiol, n-pentanethiol, n-hexanethiol, n-heptanethiol, n-octanethiol, and 2-ethylhexanethiols.

Moreover, as the aforementioned amines, amine compounds may be mentioned and examples thereof include monoamine compounds such as 3-(2-ethylhexyloxy)propylamine, ethylamine, n-propylamine, i-propylamine, n-butylamine, i-butylamine, t-butylamine, n-pentyl amine, n-hexylamine, cyclohexylamine, n-heptylamine, n-octylamine, 2-ethylhexylamine, 2-ethylhexylpropylamine, 3-ethoxypropylamine, n-nonylamine, n-decylamine, n-undecylamine, n-dodecylamine, n-tridecylamine, n-tetradecylamine, n-pentadecylamine, n-hexadecylamine, benzylamine, and aminoacetaldehyde diethyl acetal, di amine compounds such as ethylenediamine, N-methylethylenediamine, N,N'-dimethylethylenediamine, N,N,N',N'-tetramethylethylenediamine, N-ethyl-ethylenediamine, N,N'-diethylethylenediamine, 1,3-propanediamine, N,N'-dimethyl-1,3-propanediamine, 1,4-butanediamine, N,N'-dimethyl-1,4-butanediamine, 1,5-pentanediamine, N,N'-dimethyl-1,5-pentanediamine, 1,6-hexanediamine, N,N'-dimethyl-1,6-hexanediamine, and isophoronediamine, triamine compounds such as diethylenetriamine, N,N,N',N"N"-pentamethyldiethylenetriamine, N-(aminoethyl)piperazine, and N-(aminopropyl)piperazine.

Examples of the aforementioned hydrazines include 1,1-di-n-butylhydrazine, 1,1-di-t-butylhydrazine, 1,1-di-n-pentylhydrazine, 1,1-di-n-hexylhydrazine, 1,1-dicyclohexylhydrazine, 1,1-di-heptyl-n-hydrazine, 1,1-di-n-octylhydrazine, 1,1-di-(2-ethylhexyl)hydrazine, 1,1-diphenylhydrazine, 1,1-di benzylhydrazine, 1,2-di-n-butylhydrazine, 1,2-di-t-butylhydrazine, 1,2-di-n-pentylhydrazine, 1,2-di-n-hexylhydrazine, 1,2-dicyclohexylhydrazine, 1,2-di-n-heptylhydrazine, 1,2-di-n-octylhydrazine, 1,2-di-(2-ethylhexyl)hydrazine, 1,2-diphenylhydrazine, and 1,2-dibenzylhydrazine.

Examples of the aforementioned monoalcohols include methanol, ethanol, n-propyl alcohol, i-propyl alcohol, n-butyl alcohol, i-butyl alcohol, sec-butyl alcohol, pentanol, hexanol, heptanol, octanol, cyclohexanol, benzyl alcohol, and terpincol.

Examples of the aforementioned diols include ethylene glycol, propylene glycol, 1,2-butanediol, 1,2-pentanediol, 1,2-hexanediol, 2,3-butanediol, 2,3-pentanediol, 2,3-hexanediol, 2,3-heptanediol, 3,4-hexanediol, 3,4-heptanediol, 3,4-octanediol, 3,4-nonanediol, 3,4-decanediol, 4,5-octanediol, 4,5-nonanediol, 4,5-decanediol, 5,6-decanediol, 3-N,N-dimethylamino-1,2-propanediol, 3-N,N-diethylamino-1,2-propanediol, 3-N,N-di-n-propylamino-1,2-propanediol, 3-N,N-di-i-propylamino-1,2-propanediol, 3-N,N-di-n-butylamino-1,2-propanediol, 3-N,N-di-i-butylamino-1,2-propanediol, and 3-N,N-di-t-butylamino-1,2-propanediol.

Examples of the aforementioned hydroxy amines include N,N-diethylhydroxylamine, N,N-di-n-propylhydroxylamine, N,N-di-n-butylhydroxylamine, N,N-di-n-pentylhydroxylamine and N,N-di-n-hexylhydroxylamine.

Examples of the aforementioned α-hydroxy ketones include hydroxyacetone, 1-hydroxy-2-butanone, 3-hydroxy-2-butanone, 1-hydroxy-2-pentanone, 3-hydroxy-2-pentanone, 2-hydroxy-3-pentanone, 3-hydroxy-2-hexanone, 2-hydroxy-3-hexanone, 4-hydroxy-3-hexanone, 4-hydroxy-3-heptanone, 3-hydroxy-4-heptanone, and 5-hydroxy-4-octanone.

The aforementioned carboxylic acids are not particularly limited as long as they have the ability to reduce metal salts but examples thereof include formic acid, hydroxyacetic acid, glyoxylic acid, lactic acid, oxalic acid, tartaric acid, malic acid, and citric acid.

The above reducing agents can be used according to the kind of the aforementioned metal salt with appropriately selecting or combining one or two or more of the agents capable of reducing the salt. For example, in the case of using copper formate as the metal salt, the reducing agent is preferably an amine compound, and more preferably 2-ethylhexylpropylamine or 3-ethoxypropylamine.

The content of the reducing agent in the film-forming material is preferably in the range of 1% by mass to 99% by mass, and more preferably in the range of 10% by mass to 90% by mass based on the total amount of film-forming material. When the content of the reducing agent is controlled to the range of 1% by mass to 99% by mass, it is possible to form a wiring having a good conductivity. Furthermore, when the content is controlled to the range of 10% by mass to 90% by mass, it is possible to form a wiring having a low resistance value and having excellent adhesiveness to an electrode.

(Metal Fine Particles)

For the purpose of improving the reductive deposition rate of the metal salt or for the purpose of adjusting the viscosity of the film-forming material, the film-forming material may contain metal fine particles.

The metal particles are not particularly limited but, in view of conductivity and stability of the particles, for example, they are preferably particles containing one or more metal species selected from the group consisting of gold, silver, copper, platinum, and palladium. These metal species may be simple substances or alloys with other metals. In the case where these metal species are simple substances, as preferred metal fine particles, there may be mentioned at least one kind or combinations of two or more kinds selected from the group consisting of gold fine particles, silver fine particles, copper fine particles, platinum fine particles, and palladium fine particles.

Among the metal fine particles, in view of cost, easy availability, and the catalytic activity at the time of forming the wiring, metal fine particles containing one or two or more metal species selected from the group consisting of silver, copper, and palladium are preferred. Metal fine particles other than these may be used but, for example, in the case of using a copper salt as the metal salt, there is a concern that metal fine particles may be oxidized by the copper ion or the catalytic activity is lowered to decrease a reductive deposition rate from the copper salt to metallic copper, so that it is more preferable to use the aforementioned metal fine particles.

The average particle diameter of the metal fine particles is preferably in the range of 0.05 μm to 5 μm. From the viewpoint of preventing occurrence of the oxidation reaction through an increase in the activity on the metal surface and from the viewpoint of preventing aggregation of the metal fine particles, the particle diameter of the metal fine particles is preferably 0.05 μm or more. From the viewpoint of preventing precipitation of the metal fine particles upon long-term storage of the film-forming material, the average particle diameter of the metal fine particles is preferably 5 μm or less.

A method for measuring the average particle diameter is as follows.

From fields of view observed using a microscope such as a transmission electron microscope (TEM), a field emission transmission electron microscope (FE-TEM), or a field emission scanning electron microscope (FE-SEM), three portions are arbitrarily selected and pictures are taken at the most appropriate magnification for particle size measurement. From the obtained respective pictures, 100 pieces of the particles are arbitrarily selected, the long axes of the particles are measured by a transmission electron microscope (TEM), a field emission transmission electron microscope (FE-TEM), a field emission scanning electron microscope (FE-SEM), or the like, the particle diameters are calculated by dividing the length by the measuring magnification, and the average particle diameter can be determined by computing an arithmetic average of these values. Moreover, standard deviation can be determined from the particle diameters and the number of individual metal particles during the aforementioned observation.

The metal particles may be commercially available ones or may be those synthesized by a known method without particular limitation. As the known synthetic method, there may be, for example, mentioned a vapor-phase method (dry process) such as a sputtering method or an in-gas deposition method or a liquid phase method (wet process) such as a method of reducing a metal compound solution in the presence of a surface protective agent to precipitates metallic fine particles.

Although metal purity of the metal fine particles is not particularly limited, there is a concern that low purity may impart an adverse effect on the conductivity of the resultant wiring, so that the purity is preferably 95% or more, and more preferably 99% or more.

The content of the metal fine particles in the film-forming material is preferably in the range of 0% by mass to 60% by mass, more preferably from 1% by mass to 40% by mass, and particularly preferably in the range of 1% by mass to 20% by mass based on the total amount of the film-forming material.

[Solvent]

From the viewpoint of adjusting the viscosity of the film-forming material to improve the productivity of the wiring and from the viewpoint of obtaining a uniform wiring with low resistance, the material preferably contains a solvent.

As the solvent, there are mentioned organic solvents which can dissolve or disperse the respective components in the film-forming material and do not participate in the reduction reaction of the metal salt. Specifically, there are mentioned one solvent or a mixture of compatible two or more solvents selected from the group consisting of ethers, esters, aliphatic hydrocarbons, and aromatic hydrocarbons.

As the ethers, aliphatic hydrocarbons, and aromatic hydrocarbons, the compounds exemplified as [B] solvent described above are mentioned.

Examples of the esters include methyl formate, ethyl formate, butyl formate, γ-butyrolactone, and also the compounds exemplified as [B] solvent.

Among these organic solvents, particularly from the viewpoint of easiness in adjustment of the viscosity, ethers are preferable, and hexyl methyl ether, diethylene glycol dimethyl ether, and the like are particularly preferable.

The content of the solvent contained in the film-forming material is preferably in the range of 0% by mass to 95% by mass, more preferably in the range of 1% by mass to 70% by mass, and particularly preferably in the range of 10% by mass to 50% by mass based on the total amount of the film-forming material.

The film-forming material can be produced by mixing the respective components described above. The mixing method is not particularly limited but, for example, there are mentioned stirring with stirring blades, stirring with a stirrer and a stirrer bar, stirring with a boiling shaker, and stirring with ultrasonic waves (homogenizer). As for stirring conditions, for example, in the case of stirring with stirring blades, the rotational speed of the stirring blades is in the range of usually 1 rpm to 4,000 rpm, preferably in the range of 100 rpm to 2,000 rpm.

EXAMPLES

The following will describe the present invention in detail based on Examples but the invention should not be construed as being limited to Examples.

[GPC Analysis]

The weight average molecular weight (Mw) and molecular weight distribution (Mw/Mn) of the polymer (A) and the polymer (PA) were measured in terms of polystyrene using gel permeation chromatography (GPC, manufactured by Tosoh Corporation, trade name: HLC-8220) under the condition of tetrahydrofuran (THF) solvent.

Measuring method: gel permeation chromatography (GPC)
Standard substance: in terms of polystyrene
Apparatus: trade name: HLC-8220 manufactured by Tosoh Corporation
Column: guard column $H_{XL}$-H, TSK gel G7000$H_{XL}$, TSK gel GMH$_{XL}$ 2 columns, TSK gel G2000$H_{XL}$ manufactured by Tosoh Corporation were sequentially connected
Solvent: tetrahydrofuran
Sample concentration: 0.7% by mass
Injection volume: 70 μL
Flow rate: 1 mL/min

[Measurement of $^1$H-NMR]

$^1$H-NMR was measured at 25° C. in CDCl$_3$ on a nuclear magnetic resonance apparatus (AVANCEIII AV400N manufactured by Bruker).

In the present Example, a polymer that is an example of [A] compound having an acid-dissociable group in the embodiment of the present invention described above (hereinafter referred to as [A] polymer) was synthesized.

Synthesis of [A] Polymer

Synthetic Example 1

To a flask equipped with a condenser and a stirrer were charged 8 parts by mass of dimethyl 2,2'-azobis(2-methylpropionate), 2 parts by mass of 2,4-diphenyl-4-methyl-1-pentene, and 200 parts by mass of diethylene glycol dimethyl ether. Subsequently, 42 parts by mass of 2-hydroxyethyl methacrylate and 58 parts by mass of benzyl methacrylate were charged and the temperature of the solution was raised to 80° C. under nitrogen atmosphere with gentle stirring. Polymerization was performed with maintaining this temperature for 4 hours, thereby obtaining a solution containing a polymer (A-1) that is a copolymer (solid concentration=34.6% by mass, Mw=26,000, Mw/Mn=2.2). Incidentally, the solid concentration means a ratio of copolymer mass to the total mass of the copolymer solution.

Then, 13 parts by mass of diethylene glycol dimethyl ether and 4.8 parts by mass of 3,3,4,4,5,5,6,6,7,7,8,8,8-tridecafluoro-1-vinyloxyoctane were added to 10 parts by mass of the obtained solution containing the polymer (A-1), followed by sufficiently stirring. Thereafter, 0.27 parts by mass of trifluoroacetic acid was added and reaction was carried out at 80° C. for 9 hours under nitrogen atmosphere. Subsequently, the reaction solution was cooled to room temperature and the reaction was quenched by adding 0.3 parts by mass of pyridine. The resulting reaction solution was subjected to reprecipitation purification by adding the solution dropwise to a large excess of methanol, followed by dissolution in 10 parts by mass of diethylene glycol dimethyl ether. Then, the resulting solution was subjected to reprecipitation purification by adding the solution dropwise to a large excess of hexane. After drying, 6.8 parts by mass of [A] polymer (P-1) was obtained as a white solid-form copolymer. The obtained [A] polymer (P-1) was analyzed using $^1$H-NMR and it was confirmed that acetalization proceeded (chemical shift: 4.80 ppm, acetal group C—H).

Synthetic Example 2

To a flask equipped with a condenser and a stirrer were charged 8 parts by mass of dimethyl 2,2'-azobis(2-methylpropionate), 2 parts by mass of pentaerythritol tetrakis(3-mercaptopropionate), and 200 parts by mass of propylene glycol monomethyl ether. Subsequently, 75 parts by mass of 2-hydroxyethyl methacrylate and 25 parts by mass of benzyl methacrylate were charged and, after nitrogen substitution, the temperature of the solution was raised to 80° C. with gentle stirring. Polymerization was performed with maintaining this temperature for 4 hours, thereby obtaining a solution containing a polymer (A-2) that is a copolymer. The obtained solution was added dropwise to a large excess of hexane and, after drying, a white solid-form polymer (A-2) was obtained (Mw=28,000, Mw/Mn=2.3).

Then, 5 parts by mass of the polymer (A-2) was dissolved in 42 g of tetrahydrofuran and 12.4 parts by mass of 3,3,4,4,5,5,6,6,7,7,8,8,8-tridecafluoro-1-vinyloxyoctane was added thereto. After sufficient stirring, 0.66 parts by mass of trifluoroacetic acid was added and reaction was carried out at 80° C. for 9 hours under nitrogen atmosphere. Subsequently, the reaction solution was cooled to room temperature and the reaction was quenched by adding 0.7 parts by mass of pyridine. The resulting reaction solution was subjected to reprecipitation purification by adding the solution dropwise to a large excess of methanol, followed by re-dissolution in 15 parts by mass of diethylene glycol dimethyl ether. Then, the resulting solution was subjected to reprecipitation purification by adding the solution dropwise to hexane. Thus, 11.0 parts by mass of [A] polymer (P-2) was obtained as a white solid-form copolymer. The obtained [A] polymer (P-2) was analyzed using $^1$H-NMR and it was confirmed that acetalization proceeded (chemical shift: 4.80 ppm, acetal group C—H).

Synthetic Example 3

To a flask equipped with a condenser and a stirrer were charged 8 parts by mass of dimethyl 2,2'-azobis(2-methylpropionate), 2 parts by mass of 2,4-diphenyl-4-methyl-1-pentene, and 200 parts by mass of propylene glycol monomethyl ether. Subsequently, 30 parts by mass of methacrylic acid and 70 parts by mass of benzyl methacrylate were charged and, after nitrogen substitution, the temperature of the solution was raised to 80° C. with gentle stirring. Polymerization was performed with maintaining this temperature for 4 hours, thereby obtaining a solution containing a polymer (A-3) that is a copolymer. The obtained solution was added dropwise to a large excess of hexane and, after drying, a white solid-form polymer (A-3) was obtained (Mw=24,000, Mw/Mn=2.2).

Then, 5 parts by mass of the polymer (A-3) was dissolved in 34 parts by mass of diethylene glycol dimethyl ether and 9.4 parts by mass of 3,3,4,4,5,5,6,6,7,7,8,8,9,9,10,10,10-heptadecafluoro-1-vinyloxydecane was added thereto. After sufficient stirring, 0.09 parts by mass of pyridinium paratoluenesulfonate was added and reaction was carried out at 80° C. for 5 hours under nitrogen atmosphere. Subsequently, the reaction solution was cooled to room temperature and the reaction was quenched by adding 0.04 parts by mass of pyridine. The resulting reaction solution was subjected to reprecipitation purification by adding the solution dropwise to a large excess of methanol, followed by re-dissolution in 15 parts by mass of diethylene glycol dimethyl ether. Then, the resulting solution was subjected to reprecipitation purification by adding the solution dropwise to hexane. Thus, 10.9 parts by mass of [A] polymer (P-3) was obtained as a white solid-form copolymer. The obtained [A] polymer (P-3) was analyzed using $^1$H-NMR and it was confirmed that acetalization proceeded (chemical shift: 5.74 ppm, acetal group C—H).

Synthetic Example 4

To a flask equipped with a condenser and a stirrer were charged 8 parts by mass of dimethyl 2,2'-azobis(2-methylpropionate), 2 parts by mass of 2,4-diphenyl-4-methyl-1-pentene, and 200 parts by mass of propylene glycol monomethyl ether. Subsequently, 60 parts by mass of 2-methacryloyloxyethylsuccinic acid and 40 parts by mass of benzyl methacrylate were charged and, after nitrogen substitution, the temperature of the solution was raised to 80° C. with gentle stirring. Polymerization was performed with maintaining this temperature for 4 hours, thereby obtaining a solution containing a polymer (A-4) that is a copolymer. The obtained solution was added dropwise to a large excess of hexane and, after drying, a white solid-form polymer (A-4) was obtained (Mw=23,400, Mw/Mn=2.2).

Then, 5 parts by mass of the polymer (A-4) was dissolved in 20 parts by mass of tetrahydrofuran and 3.5 g of 3,3,4,4,5,5,6,6,6-nonafluoro-1-vinyloxyhexane was added thereto. After sufficient stirring, 0.06 parts by mass of pyridinium paratoluenesulfonate was added and reaction was carried out at 60° C. for 5 hours under nitrogen atmosphere. Subsequently, the reaction solution was cooled to room temperature and the reaction was quenched by adding 0.03 parts by mass of pyridine. The resulting reaction solution was subjected to reprecipitation purification by adding the solution dropwise to a large excess of methanol, followed by re-dissolution in 15 parts by mass of tetrahydrofuran. Then, the resulting solution was subjected to reprecipitation purification by adding the solution dropwise to hexane. Thus, 6.0 parts by mass of [A] polymer (P-4) was obtained as a white solid-form copolymer. The obtained [A] polymer (P-4) was analyzed using $^1$H-NMR and it was confirmed that acetalization proceeded (chemical shift: 5.74 ppm, acetal group C—H).

Synthetic Example 5

To a flask equipped with a condenser and a stirrer were charged 8 parts by mass of dimethyl 2,2'-azobis(2-methylpropionate), 2 parts by mass of 2,4-diphenyl-4-methyl-1-pentene, and 200 parts by mass of diethylene glycol dimethyl ether. Subsequently, 50 parts by mass of hydroxyphenyl methacrylate and 50 parts by mass of benzyl methacrylate were charged and the temperature of the solution was raised to 80° C. under nitrogen atmosphere with gentle stirring. Polymerization was performed with maintaining this temperature for 4 hours, thereby obtaining a solution containing a polymer (A-5) that is a copolymer (solid concentration=34.5% by mass, Mw=22,000, Mw/Mn=2.1).

Then, 10.3 parts by mass of diethylene glycol dimethyl ether and 3.6 parts by mass of perfluorocyclohexylmethyl vinyl ether were added to 10 parts by mass of the obtained solution containing the polymer (A-5), followed by sufficiently stirring. Thereafter, 0.17 parts by mass of trifluoroacetic acid was added and reaction was carried out at 80° C. for 9 hours under nitrogen atmosphere. Subsequently, the reaction solution was cooled to room temperature and the reaction was quenched by adding 0.17 parts by mass of pyridine. The resulting reaction solution was subjected to reprecipitation purification by adding the solution dropwise to a large excess of methanol, followed by re-dissolution in 15 parts by mass of diethylene glycol dimethyl ether. Then, the resulting solution was subjected to reprecipitation purification by adding the solution dropwise to hexane. Thus, 5.3 parts by mass of [A] polymer (P-5) was obtained as a white solid-form copolymer. The obtained [A] polymer (P-5) was analyzed using $^1$H-NMR and it was confirmed that acetalization proceeded (chemical shift: 5.50 ppm, acetal group C—H).

Synthetic Example 6

To a flask equipped with a condenser and a stirrer were charged 8 parts by mass of dimethyl 2,2'-azobis(2-methylpropionate), 2 parts by mass of 2,4-diphenyl-4-methyl-1- pentene, and 200 parts by mass of diethylene glycol dimethyl ether. Subsequently, 40 parts by mass of p-isopropenylphenol, 50 parts by mass of cyclohexylmaleimide, and 10 parts by mass of benzyl methacrylate were charged and, after nitrogen substitution, the temperature of the solution was raised to 80° C. with gentle stirring. Polymerization was performed with maintaining this temperature for 4 hours, thereby obtaining a solution containing a polymer (A-6) that is a copolymer (solid concentration=34.9% by mass, Mw=24,000, Mw/Mn=2.1).

Then, 7.5 parts by mass of diethylene glycol dimethyl ether and 2.4 g of perfluorophenyl vinyl ether were added to 10 parts by mass of the obtained solution containing the polymer (A-6), followed by sufficiently stirring. Thereafter, 0.2 parts by mass of trifluoroacetic acid was added and reaction was carried out at 80° C. for 9 hours under nitrogen atmosphere. Subsequently, the reaction solution was cooled to room temperature and the reaction was quenched by adding 0.2 parts by mass of pyridine. The resulting reaction solution was subjected to reprecipitation purification by adding the solution dropwise to a large excess of methanol, followed by re-dissolution in 20 parts by mass of diethylene glycol dimethyl ether. Then, the resulting solution was subjected to reprecipitation purification by adding the solution dropwise to hexane. Thus, 4.7 parts by mass of [A] polymer (P-6) was obtained as a pale yellow-white solid-form copolymer. The obtained [A] polymer (P-6) was analyzed using $^1$H-NMR and it was confirmed that acetalization proceeded (chemical shift: 5.50 ppm, acetal group C—H).

Synthetic Example 7

To a flask equipped with a condenser and a stirrer were charged 8 parts by mass of dimethyl 2,2'-azobis(2-methylpropionate), 2 parts by mass of 2,4-diphenyl-4-methyl-1-pentene, and 200 parts by mass of propylene glycol monomethyl ether. Subsequently, 45 parts by mass of glycerol monomethacrylate and 55 parts by mass of benzyl methacrylate were charged and, after nitrogen substitution, the temperature of the solution was raised to 80° C. with gentle stirring. Polymerization was performed with maintaining this temperature for 4 hours, thereby obtaining a solution containing a polymer (A-7) that is a copolymer. The obtained solution was added dropwise to a large excess of hexane and, after drying, a white solid-form polymer (A-7) was obtained (Mw=21,400, Mw/Mn=2.3).

Then, 5 parts by mass of the polymer (A-7) was dissolved in 38 parts by mass of tetrahydrofuran, and 11 parts by mass of 3,3,4,4,5,5,6,6,7,7,8,8,8-tridecafluoro-1-vinyloxyoctane was added thereto. After sufficient stirring, 0.32 parts by mass of trifluoroacetic acid was added and reaction was carried out at 60° C. for 9 hours under nitrogen atmosphere. Subsequently, the reaction solution was cooled to room temperature and the reaction was quenched by adding 0.3 parts by mass of pyridine. The resulting reaction solution was subjected to reprecipitation purification by adding the solution dropwise to a large excess of methanol, followed by re-dissolution in 20 parts by mass of tetrahydrofuran. Then, the resulting solution was subjected to reprecipitation purification by adding the solution dropwise to hexane. Thus, 9.8 parts by mass of [A] polymer (P-7) was obtained as a white solid-form copolymer. The obtained [A] polymer (P-7) was analyzed using $^1$H-NMR and it was confirmed that acetalization proceeded (chemical shift: 4.81 ppm, acetal group C—H).

Synthetic Example 8

To a flask equipped with a condenser and a stirrer was added 5 g of the polymer (A-2) obtained above, which was then dissolved in 31 parts by mass of tetrahydrofuran. Thereafter, 6.7 parts by mass of 3,3,4,4,5,5,6,6,7,7,8,8,8-tridecafluoro-1-vinyloxyoctane and 0.7 parts by mass of 1-vinyloxybutane were added thereto. After sufficient stirring, 0.66 parts by mass of trifluoroacetic acid was added and reaction was carried out at 60° C. for 9 hours under nitrogen atmosphere. Subsequently, the reaction solution was cooled to room temperature and the reaction was quenched by adding 0.7 parts by mass of pyridine. The resulting reaction solution was subjected to reprecipitation purification by adding the solution dropwise to a large excess of methanol, followed by re-dissolution in 25 parts by mass of tetrahydrofuran. Then, the resulting solution was subjected to reprecipitation purification by adding the solution dropwise to hexane. Thus, 8.4 parts by mass of [A] polymer (P-8) was obtained as a white solid-form copolymer. The obtained [A] polymer (P-8) was analyzed using $^1$H-NMR and it was confirmed that acetalization proceeded (chemical shift: 4.80 ppm, acetal group C—H).

Synthetic Example 9

To a flask equipped with a condenser and a stirrer was added 5 parts by mass of a polyvinylphenol (MARUKA LYNCUR-S-4P Maruzen Peterochemical Co., Ltd.), which was then dissolved in 50 parts by mass of tetrahydrofuran. Thereafter, 16 parts by mass of 3,3,4,4,5,5,6,6,7,7,8,8,8-tridecafluoro-1-vinyloxyoctane was added thereto and, after sufficient stirring, 0.50 parts by mass of trifluoroacetic acid was added and reaction was carried out at 60° C. for 9 hours under nitrogen atmosphere. Subsequently, the reaction solution was cooled to room temperature and the reaction was quenched by adding 0.5 parts by mass of pyridine. The resulting reaction solution was subjected to reprecipitation purification by adding the solution dropwise to a large excess of methanol, followed by re-dissolution in 30 parts by mass of tetrahydrofuran. Then, the resulting solution was subjected to reprecipitation purification by adding the solution dropwise to hexane. Thus, [A] polymer (P-9) was obtained as a white solid-form copolymer. The obtained [A] polymer (P-9) was analyzed using $^1$H-NMR and it was confirmed that acetalization proceeded (chemical shift: 5.48 ppm, acetal group C—H).

Synthetic Example 10

To a flask equipped with a condenser and a stirrer was added 5 parts by mass of a phenol novolak resin P-200 (manufactured by Arakawa Chemical Industries, Ltd.) represented by the following formula, which was then dissolved in 60 parts by mass of tetrahydrofuran. Thereafter, 20 parts by mass of 3,3,4,4,5,5,6,6,7,7,8,8,9,9,10,10,10-heptadecafluoro-1-vinyloxydecane was added thereto and, after sufficient stirring, 0.50 parts by mass of trifluoroacetic acid was added and reaction was carried out at 60° C. for 9 hours under nitrogen atmosphere. Subsequently, the reaction solution was cooled to room temperature and the reaction was quenched by adding 0.5 parts by mass of pyridine. The resulting reaction solution was subjected to reprecipitation purification by adding the solution dropwise to a large excess of methanol, followed by re-dissolution in 30 parts by mass of tetrahydrofuran. Then, the resulting solution was subjected to reprecipitation purification by adding the solution dropwise to hexane. Thus, 12.1 parts by mass of [A] polymer (P-10) was obtained as a white solid-form copolymer. The obtained [A] polymer (P-10) was analyzed using ¹H-NMR and it was confirmed that acetalization proceeded (chemical shift: 5.49 ppm, acetal group C—H).

[Chem. 14]

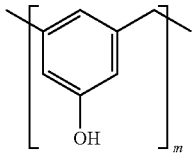

P-200

Synthetic Example 11

To a flask equipped with a condenser and a stirrer were charged 25 parts by mass of 2-hydroxyethyl methacrylate, 101 parts by mass of 3,3,4,4,5,5,6,6,7,7,8,8,8-tridecafluoro-1-vinyloxy-octane, 2.0 parts by mass of trifluoroacetic acid (TFA), and 200 parts by mass of tetrahydrofuran (THF), which were reacted under a nitrogen atmosphere with maintaining them at 60° C. for 9 hours. After cooling, 2.1 parts by mass of pyridine was added to the reaction solution to quench the reaction. The resulting reaction solution was washed with water and subjected to liquid separation. The solvent was removed on a rotary evaporator and unreacted components were removed by distillation under reduced pressure, thereby obtaining an acetalization product (M-1).

To a flask equipped with a condenser and a stirrer were charged 8 parts by mass of dimethyl 2,2'-azobis(2-methylpropionate), 2 parts by mass of 2,4-diphenyl-4-methyl-1-pentene, and 200 parts by mass of diethylene glycol dimethyl ether. Subsequently, 70 parts by mass of the acetalization product (M-1) obtained above and 30 parts by mass of benzyl methacrylate were charged and, after nitrogen substitution, the temperature of the solution was raised to 80° C. with gentle stirring. Polymerization was performed with maintaining this temperature for 4 hours, thereby obtaining a solution containing [A] polymer (P-11) that is a copolymer (Mw=23,100, Mw/Mn=2.3, ¹H-NMR chemical shift: 4.80 ppm, acetal group C—H). For the obtained solution, the solid concentration was 34.8 wt %.

Synthetic Example 12

To a flask equipped with a condenser and a stirrer were charged 25 g of 2-methacrylolyloxyethylsuccinic acid, 53 parts by mass of 3,3,4,4,5,5,6,6,7,7,8,8,8-tridecafluoro-1-vinyloxy-octane, 1.1 parts by mass of pyridinium paratoluenesulfonate (PPTSA), and 200 parts by mass of tetrahydrofuran (THF), which were reacted under a nitrogen atmosphere with maintaining them at 60° C. for 9 hours. After cooling, 0.5 parts by mass of pyridine was added to the reaction solution to quench the reaction. The resulting reaction solution was washed with water and subjected to liquid separation. The solvent was removed on a rotary evaporator and unreacted components were removed by distillation under reduced pressure, thereby obtaining an acetalization product (M-2).

[Chem. 16]

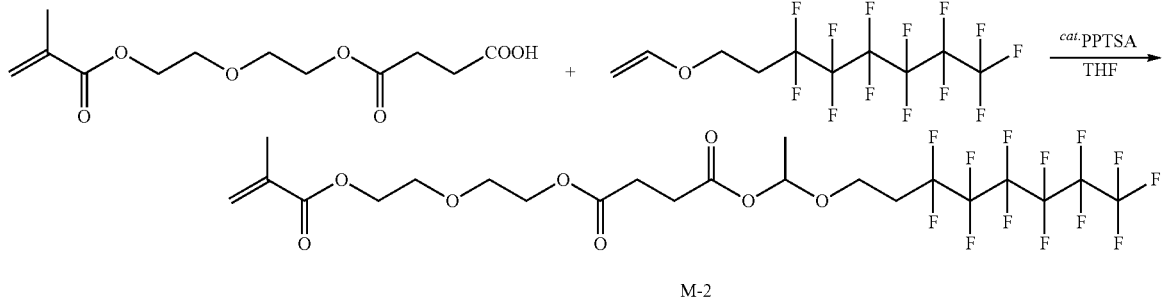

M-2

To a flask equipped with a condenser and a stirrer were charged 8 parts by mass of dimethyl 2,2'-azobis(2-methylpropionate), 2 parts by mass of 2,4-diphenyl-4-methyl-1-pentene, and 200 parts by mass of diethylene glycol dimethyl ether. Subsequently, 75 parts by mass of the acetalization product (M-2) obtained above and 25 parts by mass of benzyl methacrylate were charged and, after nitrogen substitution, the temperature of the solution was raised to 80° C. with gentle stirring. Polymerization was performed with maintaining this temperature for 4 hours, thereby obtaining a solution containing [A] polymer (P-12) that is a copolymer (Mw=24,100, Mw/Mn=2.3, ¹H-NMR chemical shift: 4.80 ppm, acetal group C—H). For the obtained solution, the solid concentration was 34.5% by mass.

Synthetic Example 13

To a flask equipped with a condenser and a stirrer were charged 25 parts by mass of hydroxyphenyl methacrylate, 82 parts by mass of 3,3,4,4,5,5,6,6,7,7,8,8,8-tridecafluoro-1-

[Chem. 15]

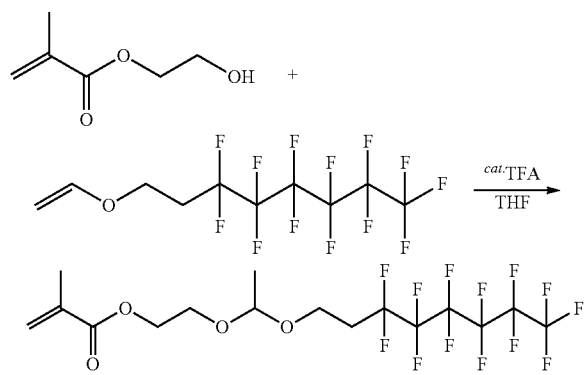

M-1 vinyloxy-octane, 1.6 parts by mass of trifluoroacetic acid (TFA), and 200 parts by mass of tetrahydrofuran (THF), which were then reacted under a nitrogen atmosphere with maintaining them at 60° C. for 9 hours. After cooling, 1.7 parts by mass of pyridine was added to the reaction solution to quench the reaction. The resulting reaction solution was washed with water and subjected to liquid separation. The solvent was removed on a rotary evaporator and unreacted components were removed by distillation under reduced pressure, thereby obtaining an acetalization product (M-3).

[Chem. 17]

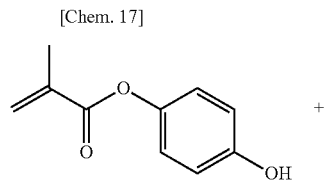

[Chem. 18]

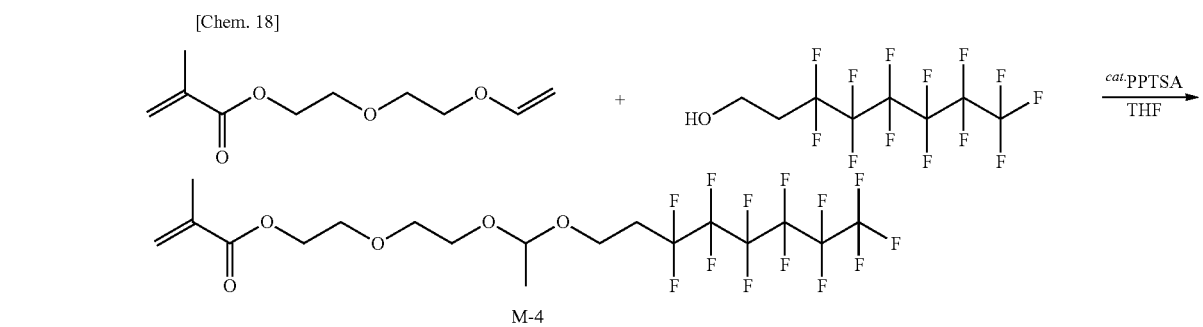

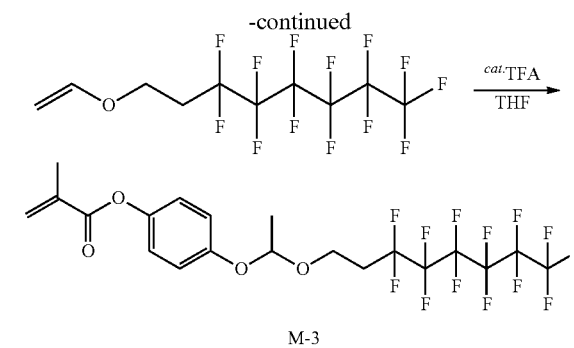

To a flask equipped with a condenser and a stirrer were charged 8 parts by mass of dimethyl 2,2'-azobis(2-methylpropionate), 2 parts by mass of 2,4-diphenyl-4-methyl-1-pentene, and 200 parts by mass of diethylene glycol dimethyl ether. Subsequently, 75 parts by mass of the acetalization product (M-3) obtained above and 25 parts by mass of benzyl methacrylate were charged and, after nitrogen substitution, the temperature of the solution was raised to 80° C. with gentle stirring. Polymerization was performed with maintaining this temperature for 4 hours, thereby obtaining a solution containing [A] polymer (P-13) that is a copolymer (Mw=21,800, Mw/Mn=2.2, $^1$H-NMR chemical shift: 5.50 ppm, acetal group C—H). For the obtained solution, the solid concentration was 35.1% by mass.

Synthetic Example 14

To a flask equipped with a condenser and a stirrer were charged 25 parts by mass of 2-(2-vinyloxyethoxy)ethyl methacrylate (VEEM, manufactured by Nippon Shokubai Co., Ltd.), 45 parts by mass of 3,3,4,4,5,5,6,6,7,7,8,8,8-tridecafluorooctanol, 1.6 g of pyridinium paratoluenesulfonate (PPTSA), and 200 parts by mass of tetrahydrofuran (THF), which were then reacted under a nitrogen atmosphere with maintaining them at room temperature for 8 hours. After completion of the reaction, 0.7 parts by mass of pyridine was added to the reaction solution to quench the reaction. The resulting reaction solution was washed with water and subjected to liquid separation. The solvent was removed on a rotary evaporator and unreacted components were removed by distillation under reduced pressure, thereby obtaining an acetalization product (M-4).

To a flask equipped with a condenser and a stirrer were charged 8 parts by mass of dimethyl 2,2'-azobis(2-methylpropionate), 2 parts by mass of 2,4-diphenyl-4-methyl-1-pentene, and 200 parts by mass of diethylene glycol dimethyl ether. Subsequently, 75 parts by mass of the acetalization product (M-4) obtained above and 25 parts by mass of benzyl methacrylate were charged and, after nitrogen substitution, the temperature of the solution was raised to 80° C. with gentle stirring. Polymerization was performed with maintaining this temperature for 4 hours, thereby obtaining a solution containing [A] polymer (P-14) that is a copolymer (Mw=22,700, Mw/Mn=2.1, chemical shift: 4.80 ppm, acetal group C—H). For the obtained solution, the solid concentration was 34.5% by mass.

<Preparation of Radiation-Sensitive Composition>

Details of respective components used in Examples and Comparative Examples will be shown below.

<[C] Acid Generator>

C-1: N-hydroxynaphalimide-trifluoromethanesulfonic acid ester

C-2: 4,7-di-n-butoxy-1-naphthyltetrahydrothiophenium trifluoromethanesulfonate

C-3: CGI725 (manufactured by BASF)

<[D] Sensitizer>

D-1: 2-isopropylthioxanthone

<[E] Quencher>

E-1: 2-phenylbenzimidazole

E-2: 4-(dimethylamino)pyridine

<[F] Polymerizable Compound>

F-1: dipentaerythritol hexaacrylate

F-2: 1,9-nonanediol diacrylate

<[G] Radiation-Sensitive Polymerization Initiator>

G-1: 2-methyl-1-(4-methylthiophenyl)-2-morpholinopropan-1-one (IRGACURE (registered trademark) 907, manufactured by BASF)

G-2: 2-dimethylamino-2-(4-methylbenzyl)-1-(4-morpholin-4-yl-phenyl)-butan-1-one (IRGACURE (registered trademark) 379, manufactured by BASF)

G-3: ethanone-1-[9-ethyl-6-(2-methylbenzoyl)-9H-carbazol-3-yl]-1-(O-acetyloxime) (IRGACURE (registered trademark) OXE02, manufactured by BASF)

Examples 1 to 14 and Comparative Examples 1 and 2

Each radiation-sensitive composition was prepared by mixing the respective components of the kinds and contents shown in Table 1, adding 0.1 parts by mass of Polyflow No 75 (manufactured by Kyoeisha Chemical Co., Ltd.), adding diethylene glycol dimethyl ether as [B] solvent so that the solid concentration became 20% by mass, and subsequently filtering the solution through a Millipore filter having a pore size of 0.5 µm. Incidentally, "-" in Table 1 indicates that the component was not used.

Incidentally, in each of Examples 11 to 14, a solution containing [A] polymer obtained in each of Synthetic Examples 11 to 14 was used in an amount corresponding to 100 parts by mass of the solid component.

amount of 250 mJ/cm². Thereafter, by five minutes baking at 110° C. using a hot plate, there was formed a film patterned with a lyophilic portion and a liquid-repellent portion in which an exposed portion (concave portion) became the lyophilic portion and a portion other than the exposure portion (convex portion) became the liquid-repellent portion (hereinafter sometimes referred to as "lyophilic-repellent patterned film"). In the formed lyophilic-repellent patterned film, contact angles of water, decane, and tetradecane on each of the surface of the coating film at the exposed portion corresponding to the lyophilic portion and the surface of the coating film at the unexposed portion corresponding to the liquid-repellent portion were measured using a contact angle meter (CA-X manufactured by Kyowa Interface Science Co., Ltd.) to confirm the lyophilic-repellent performance. In Table 2, the contact angle of water on the exposed portion surface is shown as a "lyophilic portion water" and the contact angle of water on the unexposed portion surfaces is shown as "liquid-repellent portion water". The contact angles of decane and tetradecane are shown in a similar manner.

[Confirmation of Concave Patterning Property]

With respect to the films obtained in the same manner as in [Contact Angle] mentioned above, film thickness of the exposed portion (concave portion) and the unexposed portion (convex portion) was measured by a contact-type film

TABLE 1

| | [A] Polymer | | [C] Photoacid generator | | [D] Sensitizer | | [E] Quencher | | [F] Polymerizable compound | | [G] Radiation-sensitive polymerization initiator | |
|---|---|---|---|---|---|---|---|---|---|---|---|---|
| | Kind | Content (parts by mass) | Kind | Content (parts by mass) | Kind | Content (part by mass) | Kind | Content (parts by mass) | Kind | Content (parts by mass) | Kind | Content (parts by mass) |
| Example 1 | P-1 | 100 | C-1 | 2 | D-1 | 1 | E-1 | 0.05 | — | — | — | — |
| Example 2 | P-2 | 100 | C-1 | 2 | — | — | E-1 | 0.05 | — | — | — | — |
| Example 3 | P-3 | 100 | C-2 | 2 | — | — | E-1 | 0.05 | F-1 | 5 | G-1 | 2 |
| Example 4 | P-4 | 100 | C-3 | 2 | — | — | E-1 | 0.05 | F-1 | 5 | G-1/G-2 | 2/1 |
| Example 5 | P-5 | 100 | C-1 | 2 | D-1 | 1 | E-2 | 0.05 | F-2 | 5 | G-2/G-3 | 2/1 |
| Example 6 | P-6 | 100 | C-1 | 2 | D-1 | 1 | E-2 | 0.05 | F-1/F-2 | 5/2 | G-1/G-3 | 2/1 |
| Example 7 | P-7 | 100 | C-1 | 2 | D-1 | 1 | E-1 | 0.05 | — | — | — | — |
| Example 8 | P-8 | 100 | C-2 | 2 | — | — | E-1 | 0.05 | — | — | — | — |
| Example 9 | P-9 | 100 | C-2 | 2 | — | — | E-1 | 0.05 | — | — | — | — |
| Example 10 | P-10 | 100 | C-3 | 2 | — | — | E-1 | 0.05 | — | — | — | — |
| Example 11 | P-11 | 100 | C-1 | 2 | D-1 | 1 | E-1 | 0.05 | F-1 | 5 | — | — |
| Example 12 | P-12 | 100 | C-1 | 2 | D-1 | 1 | E-1 | 0.05 | F-1 | 5 | G-1 | 2 |
| Example 13 | P-13 | 100 | C-1 | 2 | D-1 | 1 | E-1 | 0.05 | — | — | — | — |
| Example 14 | P-14 | 100 | C-2 | 2 | — | — | E-1 | 0.05 | F-2 | 3 | G-2 | 2 |
| Comparative Example 1 | A-1 | 100 | C-1 | 2 | D-1 | 1 | E-1 | 0.05 | F-1 | 5 | G-1 | 2 |
| Comparative Example 2 | A-2 | 100 | C-1 | 2 | D-1 | 1 | E-1 | 0.05 | — | — | — | — |

<Film Evaluation>

Film formation was performed using each of the radiation-sensitive compositions prepared in Examples 1 to 14 and Comparative Examples 1 and 2 and the following evaluation was conducted. The results are shown in Table 2.

[Contact Angle]

After the radiation-sensitive composition prepared in each of Examples 1 to 14 or Comparative Examples 1 and 2 was applied on an alkali-free glass substrate by a spinner, pre-baking for 2 minutes on a 90° C. hot plate was performed to form a coating film having a thickness of 0.5 Then, the resulting coating film was subjected to radiation irradiation through a quartz mask (contact) using a high pressure mercury lamp (exposure machine: MA-1400 manufactured by Japan Science Engineering Co., Ltd.) in an exposure thickness meter (manufactured by Keyence Corporation: Alpha Step IQ). Then, a concave shape-forming property was confirmed by calculating a difference between the film thickness of the exposed portion and the film thickness of the unexposed portion and calculating a film thickness decrease ratio (%) from the following equation.

Film thickness decrease ratio (%)=(Film thickness of liquid repellent portion−Film thickness of lyophilic portion)×100/Film thickness of liquid repellent portion

[Ink Application Assist Performance on Lyophilic-Repellent Pattern]

Figure 6:
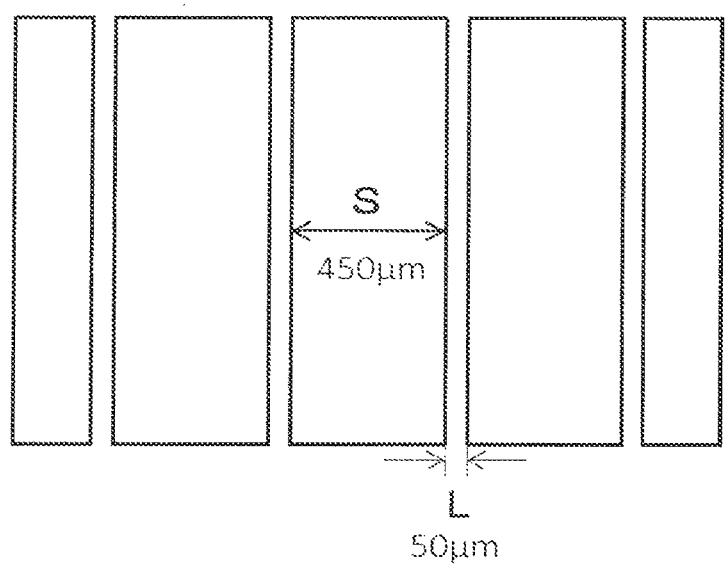
FIG. 6 is a figure showing a quartz mask used in Examples.
Figure 6:

FIG. 6 is a figure showing a quartz mask used in Examples, and FIG. 6A is a plan view and FIG. 6B is a cross-sectional view.

A lyophilic-repellent patterned film was formed in the same manner as in [Contact Angle] described above except that a quartz mask (L/S=50 μm/450 μm) as shown in FIG. 6 was used. Tetradecane was added dropwise to the vicinity of the obtained concave portion in an amount of 60 pl by means of a microcapillary using an automatic minimum contact angle meter (MCA-2 manufactured by Kyowa Interface Co., Ltd.) and the dropped portion was observed after 5 seconds on a microscope from the dropping direction (from the top).

Figure 7:
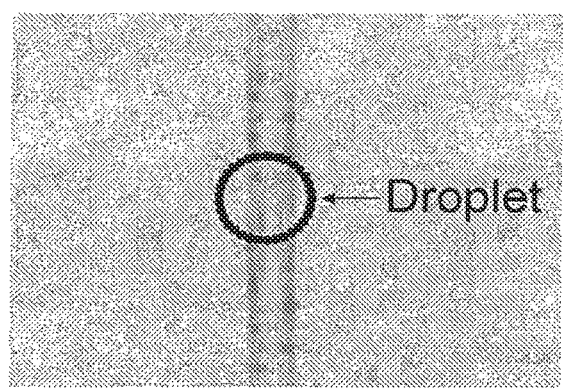
FIG. 7 is an enlarged photograph illustrating an example of a good patterning.

FIG. 7 is an enlarged photograph showing an example of a good patterning.

Figure 8:
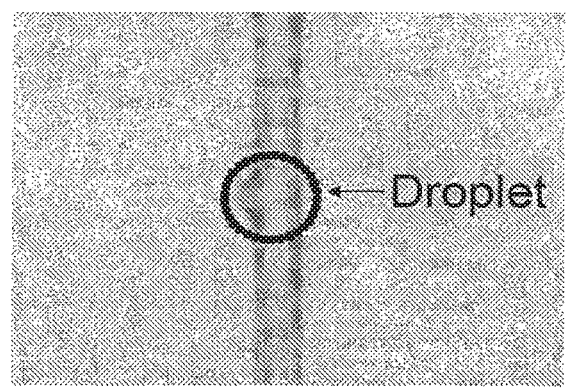
FIG. 8 is an enlarged photograph illustrating an example of a bad patterning.

FIG. 8 is an enlarged photograph showing an example of a bad patterning.

As a result, when tetradecane was patterned along the lyophilic-repellent pattern, the case was evaluated as good, that is, as shown in FIG. 7, the case where the formed concave line (FIG. 7) was not disturbed by the tetradecane droplets was evaluated as good and the case where tetradecane was present in a place other than the concave portion of the lyophilic-repellent pattern was evaluated as bad, that is, as shown in FIG. 8, the case where the concave line (FIG. 8) was disturbed by the tetradecane droplets was evaluated as bad.

Here, the reason why the appearance after five seconds from the dropwise addition of tetradecane is observed is that, when the liquid droplets can not be patterned in a short time of about 5 seconds, there is a possibility that remaining of the liquid occurs in a position different from the desired position due to drying of the liquid droplets and thus there is a concern that wiring with a desired shape may not be formed.

When patterning is unable in a short time, there is a case where remaining of the ink may occur due to drying.

[Exposure Sensitivity Evaluation in Lyophilic-Repellent Patterned Film Formation]

A lyophilic-repellent patterned film was formed in the same manner as in [Contact Angle] described above except that a quartz mask (L/S=50 μm/450 μm) in FIG. 6 was used and the exposure dose was changed to 50 mJ/cm², 100 mJ/cm², 150 mJ/cm², 200 mJ/cm², 250 mJ/cm², and 300 mJ/cm², and a film thickness decrease ratio was calculated in the same manner as in [Confirmation of Concave patterning Property] described above.

The film thickness decrease ratio increases as the exposure amount increases but sensitivity evaluation was conducted with regarding the exposure amount at the time when the film thickness decrease ratio reaches 10% or more as sensitivity.

[Resolution Evaluation in Lyophilic-Repellent Patterned Film Formation]

A lyophilic-repellent patterned film was formed in the same manner as in [Contact Angle] described above except that a quartz mask (L/S=10 μm/90 μm) was used. Tetradecane was added dropwise to the vicinity of a concave portion in a minute amount (<10 pl) by means of a microcapillary using an automatic minimum contact angle meter (MCA-2 manufactured by Kyowa Interface Co., Ltd.). Upon observation on an electron microscope (manufactured by Hitachi Ltd.: a scanning electron microscope SU3500) from the dropping direction (from the top), the case where tetradecane was able to be patterned along the lyophilic-repellent pattern was evaluated as good resolution (good) and the case where the concave line of the lyophilic-repellent pattern was disturbed, for example, the case where tetradecane was present on the place other than the concave portion of the lyophilic-repellent pattern, was evaluated as bad resolution (bad).

[Appearance Evaluation]

Using a film obtained in the same manner as in the evaluation of [Contact Angle], appearance evaluation was conducted with regarding that the case where a transparent film was obtained was taken as satisfactory (good) and the case where film roughness, whitening, or the like occurs was taken as failure (bad).

[Adhesiveness Evaluation]

Using a film obtained in the same manner as in the evaluation of [Contact Angle], evaluation was conducted with regarding that the case where a crosscut peel test was performed and no peeling occurred was taken as satisfactory (good) and the case where partial peeling occurred was taken as partial failure (bad).

TABLE 2

| | Concave patterning property | | Contact angle (°) | | | | | |
|---|---|---|---|---|---|---|---|---|
| | (Liquid-repellent portion) − (Lyophilic portion) (μm) | Film thickness decrease ratio (%) | Lyophilic portion water | Liquid-repellent portion water | Lyophilic portion decane | Liquid-repellent portion decane | Lyophilic portion tetradecane | Liquid-repellent portion tetradecane |
| Example 1 | 0.13 | 26 | 73 | 108 | 5 | 54 | 5 | 64 |
| Example 2 | 0.25 | 50 | 61 | 121 | 5 | 60 | 5 | 69 |
| Example 3 | 0.18 | 36 | 74 | 107 | 6 | 55 | 6 | 63 |
| Example 4 | 0.09 | 18 | 70 | 102 | 5 | 49 | 6 | 58 |
| Example 5 | 0.10 | 20 | 58 | 105 | 6 | 51 | 5 | 60 |
| Example 6 | 0.06 | 15 | 55 | 98 | 6 | 49 | 7 | 57 |
| Example 7 | 0.30 | 60 | 62 | 120 | 5 | 62 | 6 | 70 |
| Example 8 | 0.20 | 40 | 71 | 105 | 5 | 52 | 5 | 61 |
| Example 9 | 0.26 | 52 | 48 | 110 | 5 | 58 | 5 | 67 |
| Example 10 | 0.24 | 48 | 45 | 105 | 5 | 51 | 6 | 62 |
| Example 11 | 0.12 | 24 | 73 | 109 | 5 | 53 | 6 | 65 |
| Example 12 | 0.11 | 22 | 69 | 101 | 6 | 51 | 6 | 60 |
| Example 13 | 0.15 | 30 | 55 | 104 | 6 | 49 | 5 | 62 |
| Example 14 | 0.14 | 28 | 75 | 110 | 5 | 57 | 6 | 66 |
| Comparative Example 1 | 0.00 | 0 | 81 | 81 | 5 | 6 | 5 | 6 |

TABLE 2-continued

| | | | | | | | | |
|---|---|---|---|---|---|---|---|---|
| Comparative Example 2 | 0.01 | 2 | 74 | 75 | 6 | 7 | 7 | 7 |

| | Ink application assist performance | Exposure sensitivity (mJ/cm$^2$) | Resolution (Mm) | Appearance | Adhesiveness |
|---|---|---|---|---|---|
| Example 1 | good | 50 | good | good | good |
| Example 2 | good | 50 | good | good | good |
| Example 3 | good | 100 | good | good | good |
| Example 4 | good | 50 | good | good | good |
| Example 5 | good | 100 | good | good | good |
| Example 6 | good | 100 | good | good | good |
| Example 7 | good | 50 | good | good | good |
| Example 8 | good | 100 | good | good | good |
| Example 9 | good | 50 | good | good | good |
| Example 10 | good | 50 | good | good | good |
| Example 11 | good | 50 | good | good | good |
| Example 12 | good | 50 | good | good | good |
| Example 13 | good | 100 | good | good | good |
| Example 14 | good | 50 | good | good | good |
| Comparative Example 1 | bad | NG | bad | good | bad |
| Comparative Example 2 | bad | NG | bad | good | bad |

From the results of Table 2, it is found that the lyophilic-repellent patterned films formed using the radiation-sensitive compositions prepared in Examples 1 to 14 have good lyophilic-repellent performance, patterning property, appearance, and adhesiveness as compared with the films of Comparative Examples formed using the radiation-sensitive compositions prepared in Comparative Examples 1 and 2.

That is, the radiation-sensitive compositions prepared in Examples 1 to 14 are found to be able to impart good lyophilic-repellent performance, patterning property, appearance, and adhesiveness to the films to be formed as compared with the radiation-sensitive compositions prepared in Comparative Examples 1 and 2. It is found that the radiation-sensitive compositions prepared in Examples 1 to 14 can be suitably used in the method for manufacturing a substrate having a concave pattern of the present invention.

INDUSTRIAL APPLICABILITY

The composition of the present invention can form a film by application, and also can afford a lyophilic-repellent patterning to the film to be formed utilizing radiation irradiation. The film to be formed using the composition of the invention can assist patterning owing to the lyophilic-repellent performance at the time of application of various inks such as a conductive film-forming ink using inkjet, screen printing, gravure printing, gravure offset printing, spin coating, or the like. Moreover, the film to be formed using the composition of the invention can form a fine and elaborate pattern and the resulting pattern is also excellent in adhesiveness. The film to be formed using the composition of the invention can be suitably used as an underlying film in the printed electronics.

In the case of using an underlying film formed from the composition of the invention, a fine and elaborate wiring can be easily formed by a printing method using any of various conductive film-forming inks. Moreover, the conductive pattern of the metal wiring or the like obtained is also excellent in adhesiveness and electric conductivity and thus is suitable for the formation of an electronic circuit. Accordingly, the present invention can be utilized as a high-precision wiring technique. Also, the concave pattern obtained by the invention can be utilized for micro flow channels for biosensor applications. Furthermore, the invention provides a wiring board on which electronic devices such as semiconductor chips are mounted, and is effective for miniaturization, thinning, and high functionalization in electronic equipments such as liquid crystal displays, portable information devices including a mobile phone and the like, digital cameras, organic displays, organic EL lightings, various sensors, and wearable devices.

DESCRIPTION OF REFERENCE NUMERALS AND SIGNS

1 Substrate
2, 5 Coating film
3 Exposed portion
4 Film-forming material
6 Pattern
12 Convex portion
13 Concave portion

The invention claimed is:

1. A method for forming a conductive film, comprising:
applying a composition on a substrate to form a coating film, wherein the composition comprises an acid generator and a polymer which comprises an acid dissociable group;
irradiating a portion of the coating film with radiation;
heating the coating film after the irradiating such that at least part of the portion of the coating film is evaporated and that a concave pattern is formed on the substrate; and
applying a composition for conductive film formation on the substrate having the concave pattern to form the conducting film,
wherein the concave pattern is formed without using a development of the coating film, and
wherein a difference between a contact angle with respect to tetradecane of the irradiated portion of the coating film and a contact angle with respect to tetradecane of a portion of the coating film other than the irradiated portion is 30° or more.

2. The method according to claim 1, wherein the acid-dissociable group comprises a fluorine atom.

3. The method according to claim 1, wherein the irradiating produces a concave portion and a convex portion, and the concave portion has a film thickness of 10% or more lower than the convex portion.

4. The method according to claim 1, wherein the acid-dissociable group is a group comprising an acetal bond.

5. The method according to claim 4, wherein the group comprising an acetal bond comprises a group of formula (1-1):

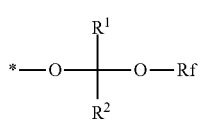

(1-1)

wherein:
R¹ and R² each independently represent a hydrogen atom or a methyl group;
Rf represents an organic group comprising a fluorine atom; and
* represents a bonding site.

6. The method according to claim 1, wherein the composition further comprises a polymerizable compound comprising an ethylenically unsaturated bond.

7. The method according to claim 6, wherein the polymerizable compound comprises a trifunctional or higher functional (meth)acrylic acid ester.

8. The method according to claim 6, wherein the composition further comprises a radiation-sensitive polymerization initiator.

9. The method according to claim 1, wherein the polymer comprises at least one constitutional unit selected from constitutional units represented by formulae (2) to (4):

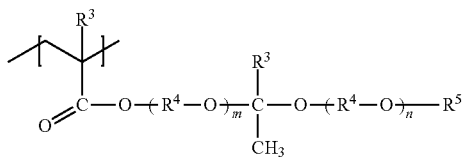

(2)

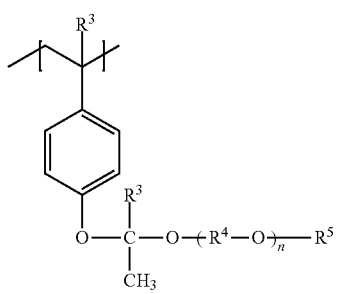

(3)

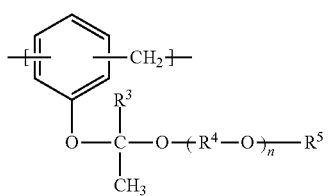

(4)

-continued

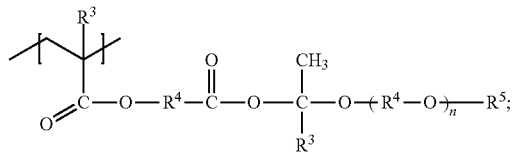

(5)

wherein:
R³ independently represents a hydrogen atom or a methyl group;
R⁴ independently represents a methylene group, an alkylene group having 2 to 12 carbon atoms, an alkenylene group having 2 to 12 carbon atoms, a substituted or unsubstituted aromatic hydrocarbon group having 6 to 12 carbon atoms, a substituted or unsubstituted alicyclic hydrocarbon group having 4 to 12 carbon atoms, or a group in which one or more hydrogen atoms of each of these groups are substituted with fluorine atom(s);
R⁵ independently represents a hydrocarbon group in which one or more hydrogen atoms are substituted with fluorine atom(s);
m represents 0 or 1; and
n independently represents an integer of 0 to 12.

10. A method for producing an electronic circuit, comprising:
applying a composition on a substrate to form a coating film, wherein the composition comprises an acid generator and a polymer which comprises an acid dissociable group;
irradiating a portion of the coating film with radiation;
heating the coating film after the irradiating such that at least part of the portion of the coating film is evaporated and that a concave pattern is formed on the substrate; and
applying an ink composition for conductive film formation on the substrate having the concave pattern to form a conducting film pattern on the substrate having the concave pattern, the conducting film pattern being included in the electronic circuit,
wherein the concave pattern is formed without using a development of the coating film, and
wherein a difference between a contact angle with respect to tetradecane of the irradiated portion of the coating film and a contact angle with respect to tetradecane of a portion of the coating film other than the irradiated portion is 30° or more.

11. An electronic circuit comprising a conductive film pattern on a substrate having the concave pattern formed by the method according to claim 10.

12. A method for producing an electronic device, comprising:
applying a composition on a substrate to form a coating film, wherein the composition comprises an acid generator and a polymer which comprises an acid dissociable group;
irradiating a portion of the coating film with radiation;
heating the coating film after the irradiating such that at least part of the portion of the coating film is evaporated and that a concave pattern is formed on the substrate; and
applying an ink composition for conductive film formation on the substrate having the concave pattern to form a conducting film pattern on the substrate having the concave pattern, the conducting film pattern being included in an electronic circuit of the electronic device, wherein the concave pattern is formed without using a development of the coating film, and wherein a difference between a contact angle with respect to tetradecane of the irradiated portion of the coating film and a contact angle with respect to tetradecane of a portion of the coating film other than the irradiated portion is 30° or more.

13. An electronic device comprising an electronic circuit formed by the methods according to claim 12.

* * * * *